United States Patent
Ogawa

(10) Patent No.: US 9,530,507 B2
(45) Date of Patent: Dec. 27, 2016

(54) NON-VOLATILE MEMORY APPARATUS AND WRITING CIRCUIT AND METHOD FOR NON-VOLATILE MEMORY APPARATUS

(71) Applicant: Powerchip Technology Corporation, Hsinchu (TW)

(72) Inventor: Akira Ogawa, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/848,340

(22) Filed: Sep. 9, 2015

(65) Prior Publication Data

US 2016/0267988 A1  Sep. 15, 2016

(30) Foreign Application Priority Data

Mar. 11, 2015 (JP) .................... 2015-048530

(51) Int. Cl.
  *G11C 16/10* (2006.01)
  *G11C 16/04* (2006.01)
  *G11C 16/34* (2006.01)

(52) U.S. Cl.
  CPC .......... *G11C 16/10* (2013.01); *G11C 16/0408* (2013.01); *G11C 16/3459* (2013.01)

(58) Field of Classification Search
  USPC .................................................. 365/185.12
  See application file for complete search history.

(56) References Cited

U.S. PATENT DOCUMENTS

| | | | |
|---|---|---|---|
| 6,903,971 B2 * | 6/2005 | Imamiya ................. | G06F 9/24 365/185.17 |
| 7,372,744 B2 * | 5/2008 | Shiga ................... | G11C 16/102 365/185.12 |
| 2005/0232011 A1 * | 10/2005 | Lee ...................... | G11C 7/1006 365/185.12 |

FOREIGN PATENT DOCUMENTS

| JP | H09147582 | 6/1997 |
|---|---|---|
| JP | 2006134482 | 5/2006 |
| JP | 2008004178 | 1/2008 |
| JP | 2008198337 | 8/2008 |
| JP | 2013127827 | 6/2013 |

* cited by examiner

*Primary Examiner* — Hoai V Ho
*Assistant Examiner* — Minh Dinh
(74) *Attorney, Agent, or Firm* — Jianq Chyun IP Office

(57) ABSTRACT

A writing circuit for a non-volatile memory apparatus is provided. The non-volatile memory apparatus includes a control circuit determining that a programming process of each memory cell is finished when performing data writing. An on/off state of a first switch is controlled according to data stored by a memory component, wherein the memory component stores a programming verify status of the corresponding memory cell. A determination control MOS transistor performs a determination control on a programming validation. A second switch applies a voltage for controlling the determination control MOS transistor to a gate of the determination control MOS transistor according to a determination control signal and sets a gate voltage of the determination control MOS transistor to a voltage value equal to a threshold voltage of the determination control MOS transistor plus a predetermined control voltage value.

16 Claims, 22 Drawing Sheets

NON-VOLATILE MEMORY APPARATUS AND WRITING CIRCUIT AND METHOD FOR NON-VOLATILE MEMORY APPARATUS

CROSS-REFERENCE TO RELATED APPLICATION

This application claims the priority benefit of Japan application serial no. 2015-048530, filed on Mar. 11, 2015. The entirety of the above-mentioned patent application is hereby incorporated by reference herein and made a part of this specification.

BACKGROUND OF THE INVENTION

Field of the Invention

The invention relates to writing circuit and method for an electrically rewritable non-volatile semiconductor memory apparatus (electrically erasable programmable read-only memory (EEPROM)), such as a flash memory, and a non-volatile memory apparatus.

Description of Related Art

A NAND type non-volatile semiconductor memory apparatus is known, wherein a plurality of memory cell transistors (called memory cells hereinafter) are connected in series between the bit line and the source line to form NAND strings, so as to achieve high integration (see Patent Literature 1, for example).

FIG. 1A is a block diagram showing the overall structure of the conventional NAND flash EEPROM. In addition, FIG. 1B is a circuit diagram showing the structure of a memory cell array and a peripheral circuit thereof in FIG. 1A.

In FIG. 1A, the conventional NAND flash EEPROM includes a memory cell array 10, a control circuit 11 controlling an operation thereof, a row decoder 12, a high voltage generation circuit 13, a page buffer circuit 14 including a data rewriting and reading circuit, a column decoder 15, a command register 17, an address register 18, an operation logic controller 19, a data input/output buffer 50, and a data input/output terminal 51.

In the memory cell array 10, as shown in FIG. 1B, sixteen electrically rewritable non-volatile memory cells MC0-MC15 having a stacked-gate structure are connected in series to form a NAND cell unit NU (NU0, NU1, ... ), for example. A drain side of each NAND cell unit NU is connected to a bit line BL through a selection gate transistor SG1, and a source side is connected to a common source line CELSRC through a selection gate transistor SG2. Control gates of the memory cells MC (e.g. MC0-MC15) arranged in a row direction are jointly connected to a word line WL (e.g. WL0-WL15). Gate electrodes of the selection gate transistors SG1 and SG2 are connected to selection gate lines SGD and SGS disposed in parallel to the word line WL. A range of the memory cells selected by one word line WL is one page serving as a writing and reading unit. One page or a range of several NAND cell units NU, which is an integer multiple of one page, serves as a unit for data erasing, namely, one block. In order to perform data writing and reading by page, the page buffer circuit 14 includes a sense amplifier circuit and a latch circuit (DL, such as latch circuits 14a and 14b respectively including a plurality of latches L1 and L2) disposed corresponding to each bit line.

The memory cell array 10 of FIG. 1B has a simplified structure, in which a plurality of bit lines may share the page buffer. Here, in an operation of writing or reading data, the bit lines selectively connected to the page buffer become the unit of one page. Moreover, FIG. 1B indicates the range of the cell array where data is inputted/outputted from/to one input/output terminal 51. In order for selection of the word line WL and the bit line BL of the memory cell array 10, the row decoder 12 and the column decoder 15 (as shown in FIG. 1A) are respectively disposed. The control circuit 11 performs sequence control of data writing, erasing, and reading. The high voltage generation circuit 13 controlled by the control circuit 11 generates a boosted high voltage or an intermediate voltage for data rewriting, erasing, and reading.

The input/output buffer 50 is used for inputting/outputting data and inputting an address signal. That is, through the input/output buffer 50 and a data signal line 52, data is transmitted between the input/output terminal 51 and the page buffer circuit 14. The address signal inputted from the data input/output terminal 51 is retained by the address register 18 and sent to the row decoder 12 and the column decoder 15 to be decoded. A command of operation control is also inputted from the data input/output terminal 51. The inputted command is decoded and retained in the command register 17, by which the control circuit 11 is controlled. An external control signal, such as a chip enable signal CEB, a command latch enable signal CLE, an address latch enable signal ALE, a writing enable signal WEB, and a reading enable signal REB, is introduced to the operation logic control circuit 19, so as to generate an internal control signal according to an operation mode. The internal control signal is used for control, e.g. data latch or transmission in the input/output buffer 50, and is sent to the control circuit 11 for operation control.

The page buffer circuit 14 includes two latch circuits 14a and 14b and is configured to switch to execute a multi-level operation function and a cache function. That is, when one memory cell stores two-level data of 1 bit, the cache function is provided; and when one memory cell stores four-level data of 2 bits, the multi-level operation function is set or, though limited by the address, the cache function is set valid.

FIG. 1C is a block diagram showing an exemplary structure of the page buffer circuit 14 and a programming end detection circuit 16 in the NAND flash EEPROM of FIG. 1A. In FIG. 1C, the programming end detection circuit 16 detects the end of programming based on a determination control signal from a page buffer PBn (n=0, 1, 2, ... N, wherein N is a positive integer). The programming (data writing) and verify determination, and counting of fail bits are explained hereinafter.

In the NAND flash EEPROM, data of one page is written into the memory cell at a time. Here, in order to check whether all the bits have been written, a programming verification process ("programming verification" may be called "verification" hereinafter) is applied for each bit. Basically, when all the bits exceed a predetermined threshold voltage Vth, it is deemed that all the bits have passed and are verified. However, in terms of recent flash memories, the bits may be deemed as in the pass status even though a few fail bits exist. This is called "pseudo-pass processing", which is used for setting "pass" in a user mode. The reason is that the bits are used during the operation based on an error checking and correction (ECC) function, and because of the many bits correctable ECC function, overall, setting a few bits as "pseudo-pass" during data writing would not cause a problem. In addition, when analyzing the programming characteristic or failure, the evaluation may be carried out by increasing or decreasing the number of the "pseudo-pass" bits to shorten the time or improve the efficiency.

FIG. 2 is a circuit diagram showing a specific exemplary structure of the programming end detection circuit 16 of FIG. 1C. In addition, FIG. 3 is a circuit diagram showing an exemplary structure of the page buffer PBn and a programming end determination part 29-$n$ of FIG. 2.

In FIG. 2, a power voltage VDD is grounded through a MOS (Metal-Oxide Semiconductor) transistor 21 and a MOS transistor 22. A connection point of the MOS transistor 21 and the MOS transistor 22 generates a status signal STB, which indicates the pass status, through a signal line A (PBPUP) and an inverter 23, i.e. a signal output line outputting the determination result. A determination enable signal JENB is applied to a gate of the MOS transistor 21, and a determination reset signal JRST is applied to a gate of the MOS transistor 22. The signal line A (PBPUP) is grounded through a MOS transistor TJn connected to each page buffer PBn and a MOS transistor TJEn whose gate is applied with a verification determination control switch signal JDG_SW (n=0, 1, . . . N). The MOS transistors TJn and TJEn constitute the programming end determination part 29-$n$ (n=0, 1, . . . N) and as a whole form the programming end determination circuit 27.

In FIG. 3, the gate of the MOS transistor TJn is connected to a node SLS1 of the latch L1 of the page buffer PBn. The page buffer PBn includes: the latch L1 including two inverters 61 and 62; the latch L2 including two inverters 63 and 64; a verification capacitor 70; a precharging transistor 71; verification transistors 72-74; column gate transistors 81 and 82; transmission switch transistors 83-85, 88, and 89; bit line selection transistors 86 and 87; and a reset transistor 90.

In FIG. 3, two bit lines BLe and BLo are selectively connected to the page buffer PBn. Meanwhile, according to a bit line selection signal BLSE or BLSO, the bit line selection transistor 86 or 87 is turned on, and one of the bit line BLe and the bit line BLo is selectively connected to the page buffer PBn. Moreover, while one of the bit lines is selected, the other bit line in a non-selected state is set to a fixed ground potential or a power voltage potential according to a bit line non-selection signal YBLE or YBLO, thereby reducing the noise between the adjacent bit lines.

The page buffer PBn of FIG. 3 includes the latch L1 and the latch L2. The page buffer PBn mainly helps the reading and writing operations through predetermined operation control. In addition, the latch L2 is a secondary latch circuit that realizes the cache function in a two-level operation, and assists the operation of the page buffer PBn to achieve a multi-level operation when not using the cache function.

The latch L1 is formed by connecting clocked inverters 61 and 62 in reverse parallel. The bit lines BLe and BLo of the memory cell array 10 are connected to a sense node N1 through the transmission switch transistor 85, and the sense node N1 is further connected to a data retention node SLR1 of the latch L1 through the transmission switch transistor 83. The precharging transistor 71 is disposed at the sense node N1. The data retention node SLR1 is connected to a temporary storage node N3 that is for temporarily storing the data of the data retention node SLR1 through the transmission switch transistor 74. The node N3 is connected to the gate of the transistor 72; the drain of the transistor 72 is connected to a voltage V2; the source is connected to the sense node N1 through the switch transistor 73; and the connection or blocking between the sense node N1 and the voltage V2 is controlled according to a gate control voltage REG of the switch transistor 73 and the voltage value of the node N3. Furthermore, the precharging transistor 71 is also connected to the sense node N1 for precharging the bit lines BLe and BLo with the voltage V1. The capacitor 70 for maintaining the voltage level is connected to the sense node N1. Another end of the capacitor 70 is grounded.

Same as the latch L1, the latch L2 is formed by connecting clocked inverters 63 and 64 in reverse parallel. Two data nodes SLR2 and SLS2 of the latch L2 are connected to the data signal line 52 through the column gate transistors 81 and 82 that are controlled according to a column selection signal CSL (e.g. CSL0-CSL511 as shown in FIG. 1B), and the data signal line 52 is connected to the data input/output buffer 50. The node SLR2 is connected to the sense node N1 through the transmission switch transistor 84.

FIG. 1B illustrates the connection relation between the memory cell array 10, the page buffer PBn, and the data input/output buffer 50. A processing unit of reading and writing of the NAND flash EEPROM is the capacity of one page that is simultaneously selected at a certain row address (e.g. 512 bytes). Since there are eight data input/output terminals 51, it is for example 512 bits for one data input/output terminal 51, and FIG. 1B illustrates the structure of the 512 bits.

When writing data to the memory cell, the written data is introduced to the latch L2 from the data signal line 52. In order to start the writing operation, the written data needs to be in the latch L1. Thus, the data retained in the latch L2 is then transmitted to the latch L1. In the reading operation, in order to output the data to the data input/output terminal 51, the read data needs to be in the latch L2. Thus, the data read from the latch L1 needs to be transmitted to latch L2. Therefore, it is configured that the transmission switch transistors 83 and 84 are set to the on state, and the data is transmitted between the latch L1 and the latch L2. Here, the latch circuit as the transmission target is set to an inactive state for data transmission and then restored to an active state for retaining data.

Hereinafter, an operation of the programming end detection circuit 16 of FIG. 2 and FIG. 3 is explained.

First, data "1" is set to the latch L1 of the page buffer PBn corresponding to the memory cell that is not the programming target, and the voltage of the data retention node SLR1 becomes a high level, so as to be excluded from the verification determination process. For the memory cell that is the programming target, when the programming verification fails, in a state of setting data "0" to the latch L1 of the page buffer PBn, the voltage of the data retention node SLR1 becomes a low level. When the programming verification is passed, data "1" is set to the latch L1 of the page buffer PBn, and the voltage of the data retention node SLR1 becomes the high level. The status of the latches L1 is reflected as the on/off state of the MOS transistor TJn and is used for the verification determination process. As shown in FIG. 2, the MOS transistor TJn (n=0, 1, . . . N) is connected to the signal line A (PBPUP) that performs a NOR (Not OR) operation. If the programming for all memory cells of one page ends and all the data retention nodes SLR1 become the high level, all the MOS transistors TJn are turned off. At the moment, the signal line A (PBPUP) becomes the high level and the status signal STB becomes the low level, by which it is known that the programming ends.

Hereinafter, the conventional "pseudo-pass programming" is explained.

FIG. 4 is a circuit diagram showing an exemplary structure of a programming end detection circuit 16A for pseudo-pass determination in the NAND flash EEPROM of FIG. 1A.

On the left side of FIG. 4, the programming end determination circuit 27 including programming end determination parts 29-0-29-N is disposed, and on the signal line A (PBPUP), a drain current n×Id, which is n times the drain current Id, flows through the MOS transistor 24 from the power voltage VDD, wherein n is an integer. The integer n is the number of the circuits 29-n through which the drain current Id flows and is equivalent to the number of the memory cells that have not passed the programming verification. Further, a reference voltage generation circuit 28 on the right side of FIG. 4 includes reference voltage generation parts 29a-0-29a-J and is formed by a plurality of MOS transistors (BFj and BFEj) connected between a signal line A' (PBREF) and the ground (here, j=0, 1, . . . J; and J is a positive integer). Here, the MOS transistors BF1-BFJ and BFE1-BFEJ are replica circuits. In order that the current Id flowing through the replica circuit MOS transistors BF1-BFJ and BFE1-BFEJ is the same as the drain current Id of the circuit 29, the transistor sizes of the MOS transistors BF1-BFJ and BFE1-BFEJ and the applied voltages are set completely equal. The sizes of the MOS transistors BF0 and BFE0 or the gate voltage is controlled such that the drain current flowing through the MOS transistors BF0 and BFE0 is 0.5×Id. Moreover, in the signal line PBREF, a threshold reference current Iref flows through the MOS transistor 25 from the power voltage VDD. The threshold reference current Iref is a sum of a unit reference current applied by each reference current generation part that respectively includes a pair of MOS transistors (BF0, BFE0; BF1, BFE1; BF2, BFE2; . . . ).

In addition, corresponding to the number n of the turn-on MOS transistors TJn (n=0, 1, . . . N) in the programming end determination circuit 27, while a voltage corresponding to the drain current n×Id flowing through the MOS transistor 24 is applied to an inverted input terminal of a comparator 26, a voltage corresponding to the threshold reference current Iref flowing through the MOS transistor 25 is applied to a non-inverted input terminal of the comparator 26, and the comparator 26 outputs the status signal STB at low level when n×Id<Iref That is, for the MOS transistors BFj and BFEj of a J+1 group through which the threshold reference current Iref flows (j=0, 1, . . . J), when the number N of the memory cells that do not pass the programming verification is smaller than or equal to J (J≥N), the status signal STB becomes the low level and it is determined as "pseudo-pass". For example, when J=2, the threshold reference current Iref is 2.5×Id (Iref=2.5×Id). Therefore, the drain current N×Id flowing through the programming end determination circuit 27 is pseudo-pass due to N≤2.

FIG. 5 is a flowchart showing a programming pass determination process of the NAND flash EEPROM of FIG. 1A. In FIG. 5, data is loaded first. In Step S2, the data is programmed and then verified in Step S3. In Step S4, if all the memory cells (one page) are "1", it is determined as "true pass" in Step S5 and the process ends. On the other hand, if the result of Step S4 is "No", whether it is "time out" or not is determined in Step S6. If the result is "No", the process returns to Step S2; otherwise, the process moves on to Step S7. In Step S7, whether it is a tolerable error is determined. If the result is "Yes", the process moves on to Step S8. If "No", the process moves on to Step S9. In Step S8, it is determined as "pseudo-pass" and the process ends. In Step S9, it is determined as "failure" and the process ends.

PRIOR ART LITERATURE

Patent Literature 1: Japanese Patent Publication No. H09-147582
Patent Literature 2: Japanese Patent Publication No. 2006-134482
Patent Literature 3: Japanese Patent Publication No. 2013-127827
Patent Literature 4: Japanese Patent Publication No. 2008-004178
Patent Literature 5: Japanese Patent Publication No. 2008-198337

SUMMARY OF THE INVENTION

Problem to be Solved

Recent NAND flash memories have the ECC (Error Checking and Correction) capacity of 4 bits or more. Therefore, a part of the ECC capacity may be allocated for rescuing fail bits of data programming and/or erasing, as shown in FIG. 4. The current Id×n of the signal line A (PBPUP) is compared with the reference current Iref of the reference signal line PBREF. When the MOS transistor BF0 is turned on and the reference current Iref is equal to 0.5×Id (Iref=0.5×Id), if the number of the memory cells that are not programmed is one or more, the programming end notification signal STB becomes the high level to indicate the failure state. On the other hand, if all the memory cells have been programmed, the programming status becomes the pass state and the programming end notification signal STB becomes the low level. In addition, when the reference current Iref is set to 2.5×Id, even if the number of the memory cells that are not programmed is 2 or less, the pass state is still set, which is the "pseudo-pass state". Due to the development of scaling of NAND flash memories, the number of the bits repaired by ECC increases and the number of pseudo-pass bits may increase. However, such a simple programming end detection circuit 16A is unable to deal with the pseudo-pass state of a large number of bits.

FIG. 6 is a plan view showing an exemplary configuration of the MOS transistors that constitute the page buffer PBn and the programming end determination part 29-n of FIG. 3. Part (a) of FIG. 6 is a plan view of disposing the gate in the direction of the bit line. Part (b) of FIG. 6 is a plan view of disposing the gate perpendicularly to the bit line. In FIG. 6, G1 and G2 are the gates; AR1 and AR2 are active regions; and CH1 and CH2 are contact holes.

For instance, in the exemplary structure of the NAND flash memory, the pitch between a pair of memory cells is 30 nm×2, the page buffer PBn is laid out in a space of sixteen bit lines, and the pitch of the page buffer PBn is 0.96 μm. Here, in each layout, eight page buffers PBn are stacked.

In FIG. 6, the MOS transistors TJn and TJEn are formed in a very narrow pitch layout of the page buffer PBn, namely 0.96 μm, for example. An area of 2×0.96 μm may also be used. However, if this size is used for all parts, the height of the page buffer PBn would be doubled and the size of the page buffer PBn would increase significantly. Therefore, the following problem exists. That is, as the flash memory is miniaturized, the MOS transistors need to be made smaller, which increases the deviation of electrical characteristics of the MOS transistors.

It is very possible that the page size may increase further in the future. As a result, the deviation of the electrical characteristics of the MOS transistors in one chip will increase accordingly. Provided that the deviation of the electrical characteristics of each of the MOS transistors is 10%, the overall deviation of the electrical characteristics of five MOS transistors will reach 50% of the electrical characteristics of a MOS transistor. Thus, the programming end detection circuit 16A of FIG. 4 is unable to accurately carry out the determination. It means that the pseudo-pass of 3 bits is the limit of accurate determination. Due to the scaling development of NAND flash memories, the deviation of MOS transistors will cause great influence to the pseudo-pass determination.

In a situation where the MOS transistors TJn and TJEn each have a 10% deviation:

(1) If four of the memory cells that are the programming targets are not programmed, the drain current is $(4\pm0.4)$Id at worst.

(2) If five of the memory cells that are the programming targets are not programmed, the drain current is $(5\pm0.5)$Id at worst.

Here, in the case of (4, 5) determination (represented by (the number of cells that pass, the number of cells that fail)), the determination needs to be based on the reference current Iref of $4.5\times$Id. However, for the aforementioned (2), there is no sense margin at worst. Thus, for security determination, at least (3, 4) determination is necessary, and the determination needs to be based on the reference current Iref of $3.5\times$Id.

The invention provides a writing circuit and a writing method for a non-volatile memory apparatus and the non-volatile memory apparatus, capable of performing the process of programming verification determination with high accuracy even if the transistor size of the peripheral circuit is reduced due to shrink of the pitch of the memory cells that results from scaling of the non-volatile memory apparatus, such as a NAND flash memory.

Solution to the Problem

In an embodiment of the invention, a writing circuit for a non-volatile memory apparatus is provided. The non-volatile memory apparatus includes a control circuit, which is disposed in a page buffer temporarily storing data when writing the data to a memory cell and determines that programming of each memory cell ends when writing the data to the memory cell.

The control circuit includes: a first switch disposed between a pair of signal lines that outputs a programming end determination signal, wherein an on/off state of the first switch is controlled according to data stored by a memory component, and the memory component stores a programming verification status of the corresponding memory cell; a determination control metal-oxide-semiconductor (MOS) transistor disposed between the pair of signal lines and performing a determination control of the programming verification; and a second switch connected between a gate and a source or a drain of the determination control MOS transistor and applying a voltage that controls the determination control MOS transistor to the gate of the determination control MOS transistor according to a predetermined determination control signal, wherein the control circuit sets a gate voltage of the determination control MOS transistor to a voltage value obtained by adding a predetermined control voltage value to a threshold voltage of the MOS transistor before performing the programming verification.

In the writing circuit for the non-volatile memory apparatus, the predetermined control voltage value is a voltage value in a range of 0 V to 0.5 V.

Moreover, the writing circuit for the non-volatile memory apparatus further includes: a circuit that applies the predetermined control voltage value, which is controlled to be a fixed value according to a predetermined reference current, to the gate voltage of the determination control MOS transistor.

In the writing circuit for the non-volatile memory apparatus, the first switch and the second switch are N channel MOS transistors or P channel MOS transistors.

In addition, in the writing circuit for the non-volatile memory apparatus, a gate of a MOS transistor that serves as the first switch is connected to any end of a latch of the page buffer or an end of a capacitor that temporarily stores data in a circuit of the page buffer.

The writing circuit for the non-volatile memory apparatus further includes: a third switch disposed between the pair of signal lines and cutting a current pass between the pair of signal lines according to a predetermined determination enable signal.

In the writing circuit for the non-volatile memory apparatus, the control circuit sets the gate voltage of the determination control MOS transistor to the voltage value obtained by adding the predetermined control voltage value to the threshold voltage of the MOS transistor after the data stored by the memory component that stores the programming verification status of the corresponding memory cell is inverted.

In the writing circuit for the non-volatile memory apparatus, the control circuit does not invert the data stored by the memory component that stores the programming verification status of the corresponding memory cell and sets the gate voltage of the determination control MOS transistor to the voltage value obtained by adding the predetermined control voltage value to the threshold voltage of the MOS transistor, wherein the predetermined control voltage value is controlled to be the fixed value according to the predetermined reference current.

In the writing circuit for the non-volatile memory apparatus, the determination control MOS transistor includes a stack gate type MOS transistor that includes a control gate and a floating gate, and the floating gate is connected to an end of the second switch, wherein the control circuit:

(1) sets the floating gate to the voltage value obtained by adding the predetermined control voltage value to the threshold voltage of the MOS transistor in a state of setting a predetermined reference voltage applied to the control gate to 0 V in an initial state, and (2) controls the reference voltage of the control gate such that a drain current that flows through the determination control MOS transistor becomes the reference current in a control operation state of verification determination.

Furthermore, the writing circuit for the non-volatile memory apparatus includes: a programming end determination circuit including a plurality of programming end determination parts and determining a programming end of a plurality of memory cells, wherein the programming end determination parts include the control circuit connected to the pair of signal lines; a reference current generation circuit including a plurality of reference current generation parts and generating a threshold reference current for determining the number of the programming ends among the memory cells, wherein the reference current generation parts respectively include a first MOS transistor connected to a pair of other signal lines and applying a predetermined unit reference current; and a comparator including a voltage corresponding to the current flowing through the programming end determination circuit with the threshold voltage corresponding to the threshold reference current flowing through the reference current generation circuit, and outputting a determination signal that indicates determination of the programming end.

Moreover, in the writing circuit for the non-volatile memory apparatus, a plurality of second MOS transistors are connected in parallel to form the first MOS transistor of each reference current generation part.

A non-volatile memory apparatus in an embodiment of the invention includes the writing circuit.

In an embodiment of the invention, a writing method for a non-volatile memory apparatus is provided. The non-volatile memory apparatus includes a control circuit, which is disposed in a page buffer temporarily storing data when writing the data to a memory cell and determines that programming of each memory cell ends when writing the data to the memory cell. The control circuit includes: a first switch disposed between a pair of signal lines that outputs a programming end determination signal, wherein an on/off state of the first switch is controlled according to data stored by a memory component, and the memory component stores a programming verification status of the corresponding memory cell; a determination control MOS transistor disposed between the pair of signal lines and performing a determination control of the programming verification; and a second switch connected between a gate and a source or a drain of the determination control MOS transistor and applying a voltage that controls the determination control MOS transistor to the gate of the determination control MOS transistor according to a predetermined determination control signal, wherein the writing method for the non-volatile memory apparatus includes: a control step of setting a gate voltage of the determination control MOS transistor to a voltage value obtained by adding a control voltage value to a threshold voltage of the MOS transistor before performing the programming verification, wherein the control voltage value is controlled to be a fixed value according to a predetermined reference current.

In the writing method for the non-volatile memory apparatus, the control step includes a step of setting the gate voltage of the determination control MOS transistor to the voltage value obtained by adding the control voltage value to the threshold voltage of the MOS transistor after inverting the data stored by the memory component that stores the programming verification status of the corresponding memory cell, wherein the control voltage value is controlled to be the fixed value according to the predetermined reference current.

Moreover, in the writing method for the non-volatile memory apparatus, the control circuit further includes a third switch disposed between the pair of signal lines and cutting a current pass between the pair of signal lines according to a predetermined determination enable signal. The control step includes a step of setting the gate voltage of the determination control MOS transistor to the voltage value obtained by adding the control voltage value to the threshold voltage of the MOS transistor without inverting the data stored by the memory component that stores the programming verification status of the corresponding memory cell, wherein the control voltage value is controlled to be the fixed value according to the predetermined reference current.

In addition, in the writing method for the non-volatile memory apparatus, the determination control MOS transistor includes a stack gate type MOS transistor that includes a control gate and a floating gate. The floating gate is connected to an end of the second switch. The control step includes:

(1) a step of applying a predetermined floating gate reference voltage to the floating gate in a state of setting a reference voltage applied to the control gate to 0 V in an initial state; and (2) controlling the floating gate reference voltage such that a drain current that flows through the determination control MOS transistor becomes the predetermined reference current in a control operation state of verification determination.

Effects of the Invention

According to the writing circuit and method for the non-volatile memory apparatus of the invention, the process of programming verification determination can be performed with high accuracy even if the transistor size of the peripheral circuit is reduced due to shrink of the pitch of the memory cells that results from scaling of the non-volatile memory apparatus, such as a NAND flash memory.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
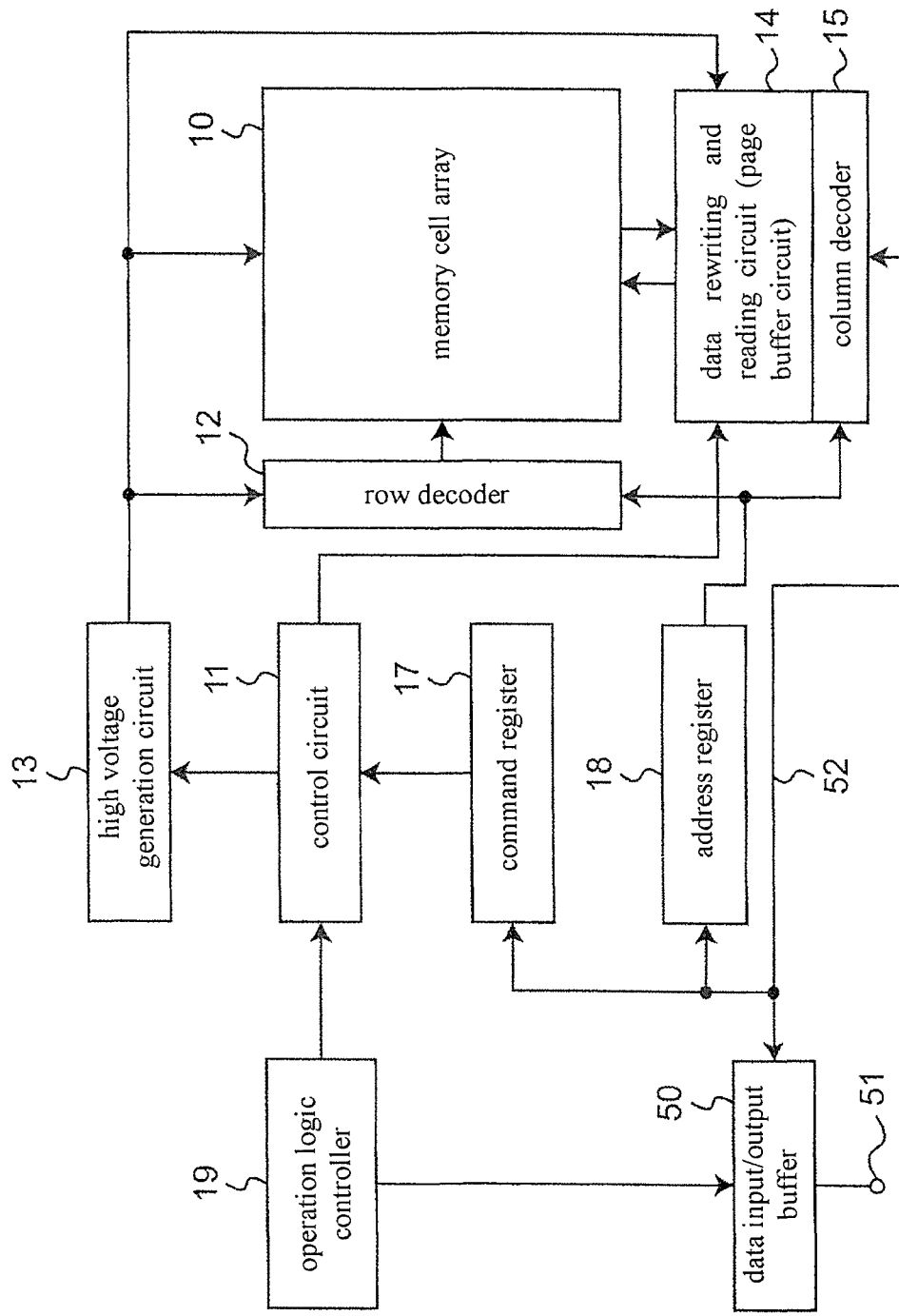
FIG. 1A is a block diagram showing the overall structure of the conventional NAND flash EEPROM.
Figure 1B:
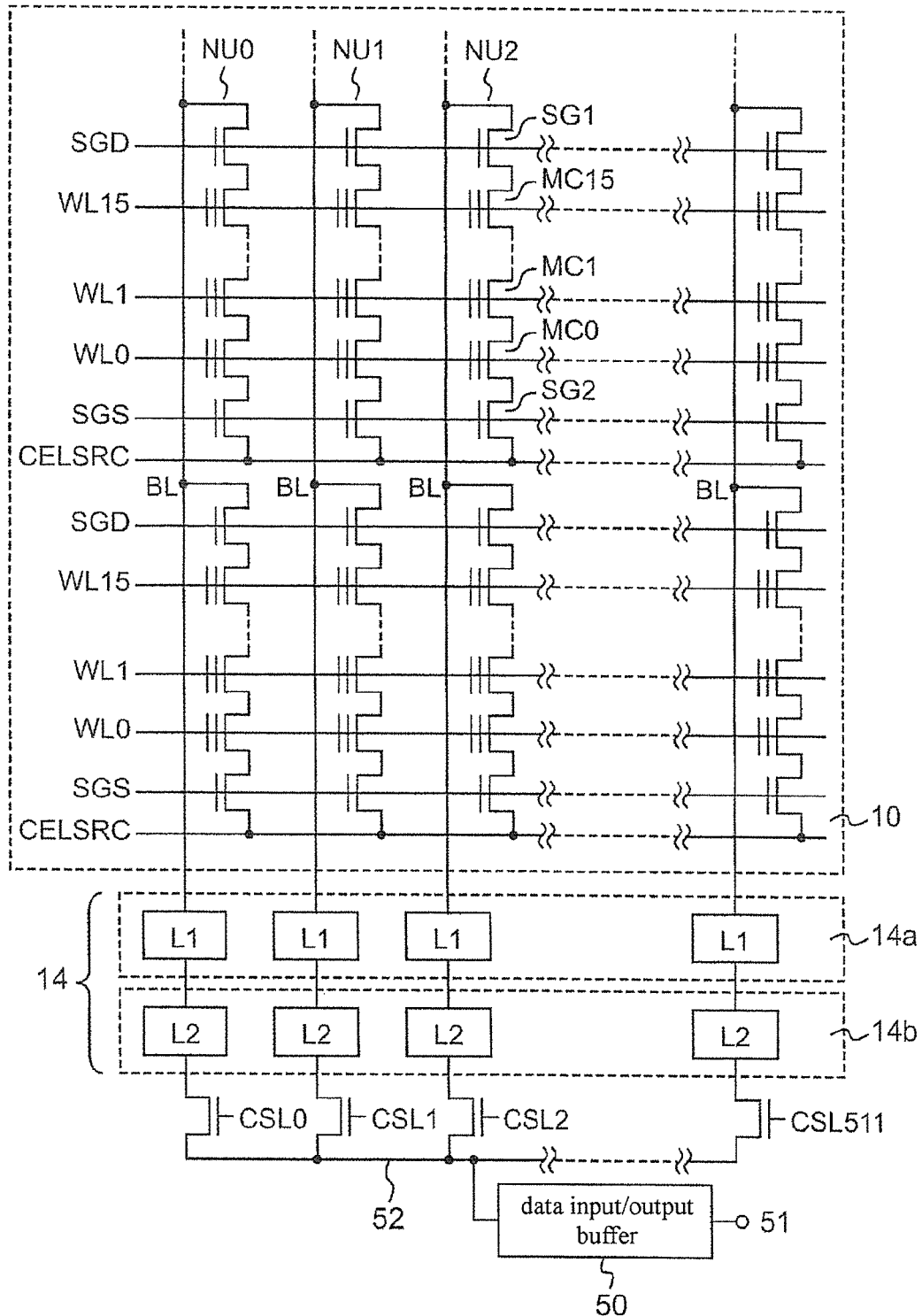
FIG. 1B is a circuit diagram showing the structure of the memory cell array 10 and the peripheral circuit thereof in FIG. 1A.
Figure 1C:
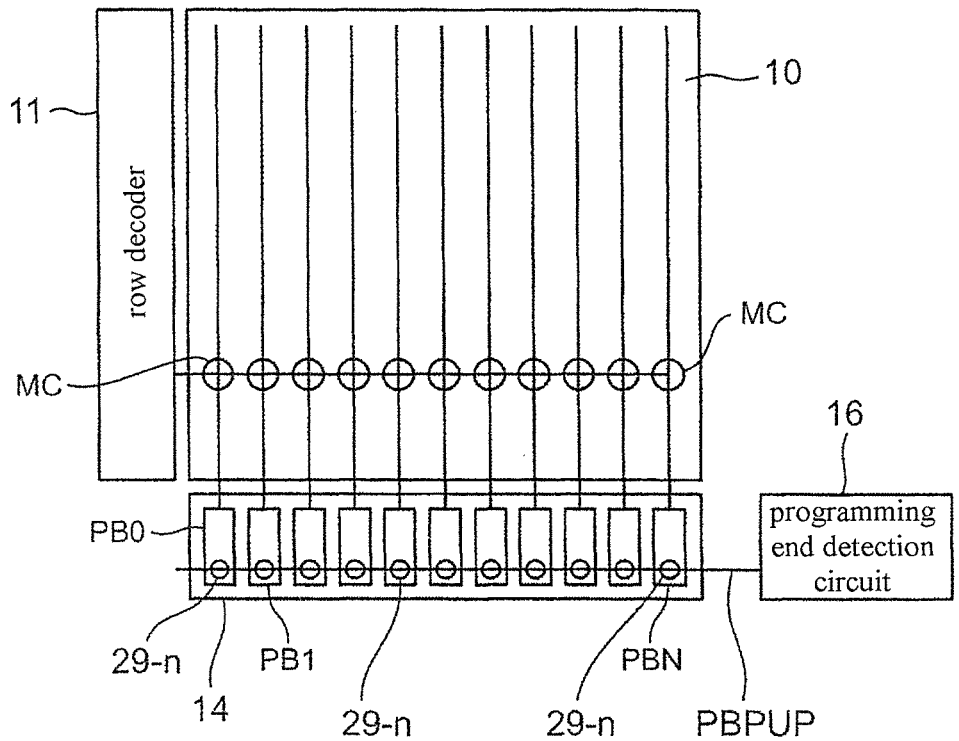
FIG. 1C is a block diagram showing an exemplary structure of the page buffer circuit 14 and the programming end detection circuit 16 in the NAND flash EEPROM of FIG. 1A.
Figure 2:
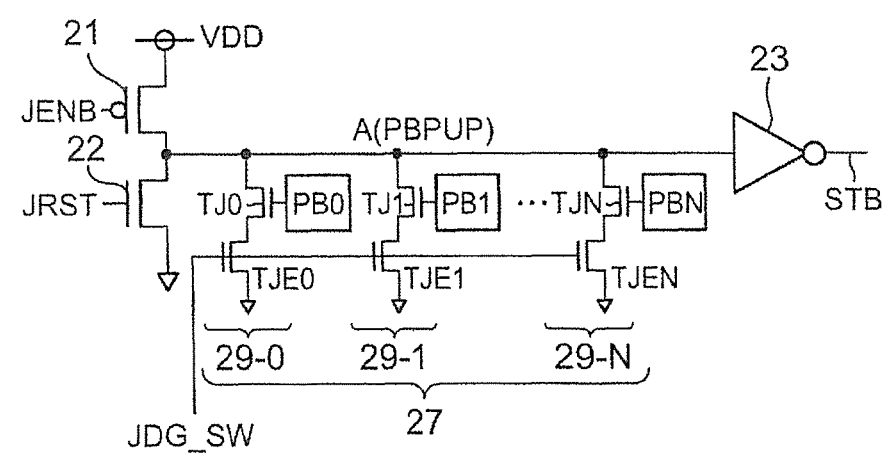
FIG. 2 is a circuit diagram showing a specific exemplary structure of the programming end detection circuit 16 of FIG. 1C.

Embodiments of the invention are described hereinafter with reference to the figures. In the following embodiments, identical components/elements are assigned with the same reference numerals.

First Embodiment

Figure 7:
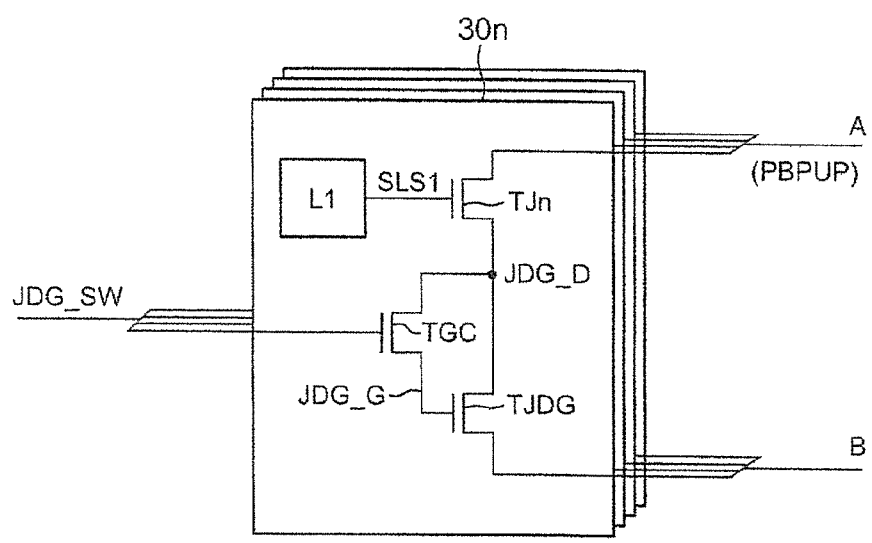
FIG. 7 is a circuit diagram showing the structure of the programming end determination part 30n of the first embodiment.

FIG. 7 is a circuit diagram showing the structure of a programming end determination part 30*n* for a non-volatile memory apparatus, e.g. a NAND flash memory, of the first embodiment. In FIG. 7, the programming end determination part 30*n* of the first embodiment is disposed corresponding to each page buffer PBn, and a plurality of programming end determination parts 30*n* (n=0, 1, . . . N) are disposed in parallel connection with respect to a determination control signal JDG_SW and a signal line A (PBPUP) and a signal line B. In addition to an N channel MOS transistor TJn for the latch L1, the programming end determination part 30*n* is further provided with N channel MOS transistors TGC and TJDG. Here, the signal line A and the signal line B are a pair of signal lines for outputting a programming end determination signal. Moreover, TJDG is a MOS transistor for determination control, used for controlling determination of the programming end. TGC is a switch that controls the MOS transistor TJDG based on the determination control signal JDG_SW.

In FIG. 7, the determination control signal JDG_SW is a control signal that changes from the low level to the high level when the programming verification operation begins, like the conventional example, but changes from the high level to the low level when pass determination of the programming verification is performed. In addition, the determination control signal JDG_SW is applied to the gate of the MOS transistor TGC. The latch L1 of the page buffer PBn is a temporary memory element that stores the programming verification status of the memory cell corresponding to the page buffer PBn. The node SLS1 of the latch L1 of the page buffer PBn is connected to the gate of the MOS transistor TJn. The signal line A (PBPUP) is a signal line for a logical OR operation and is disposed in the page buffer circuit 14 for verification determination, and the signal line A (PBPUP) is connected to the signal line B through the MOS transistor TJn and the MOS transistor TJDG. The drain of the MOS transistor TJDG is further connected to the gate of the MOS transistor TJDG through the MOS transistor TGC. Here, JDG_D represents the signal voltage of the drain of the MOS transistor TJDG, and JDG_G represents the gate voltage of the MOS transistor TJDG.

In addition, the drain current Id in a saturation region of the MOS transistor TJDG for programming verification determination is represented by the following equation.

$$Id = (1/2)\beta(Vgs - Vth)^2 \quad (1)$$

Here, Vgs represents the voltage between the gate and the source of the MOS transistor TJDG, and Vth represents the threshold voltage of the MOS transistor TJDG. Hereinafter, the threshold voltage of the N channel MOS transistor is represented by Vtn, and the threshold voltage of the P channel MOS transistor is represented by Vtp.

As shown in Equation (1), the drain current Id has two factors, i.e. the voltage difference (Vgs−Vth) and β. This embodiment is characterized in that the deviation of the factor of the voltage difference (Vgs−Vth) is eliminated by maintaining the voltage difference (Vgs−Vth) at 0.1V, i.e. (Vgs−Vth)=0.1 V, for example. Since the deviation is squared, the effect of eliminating the deviation is significant. In order to achieve the elimination, MOS transistors TGC and TJn are further provided. The control sequence thereof is described below with reference to FIG. 8. Besides, the voltage difference (Vgs−Vth) is preferably 0.1 V, but may be set in a range of 0 V-0.5 V.

Figure 8:
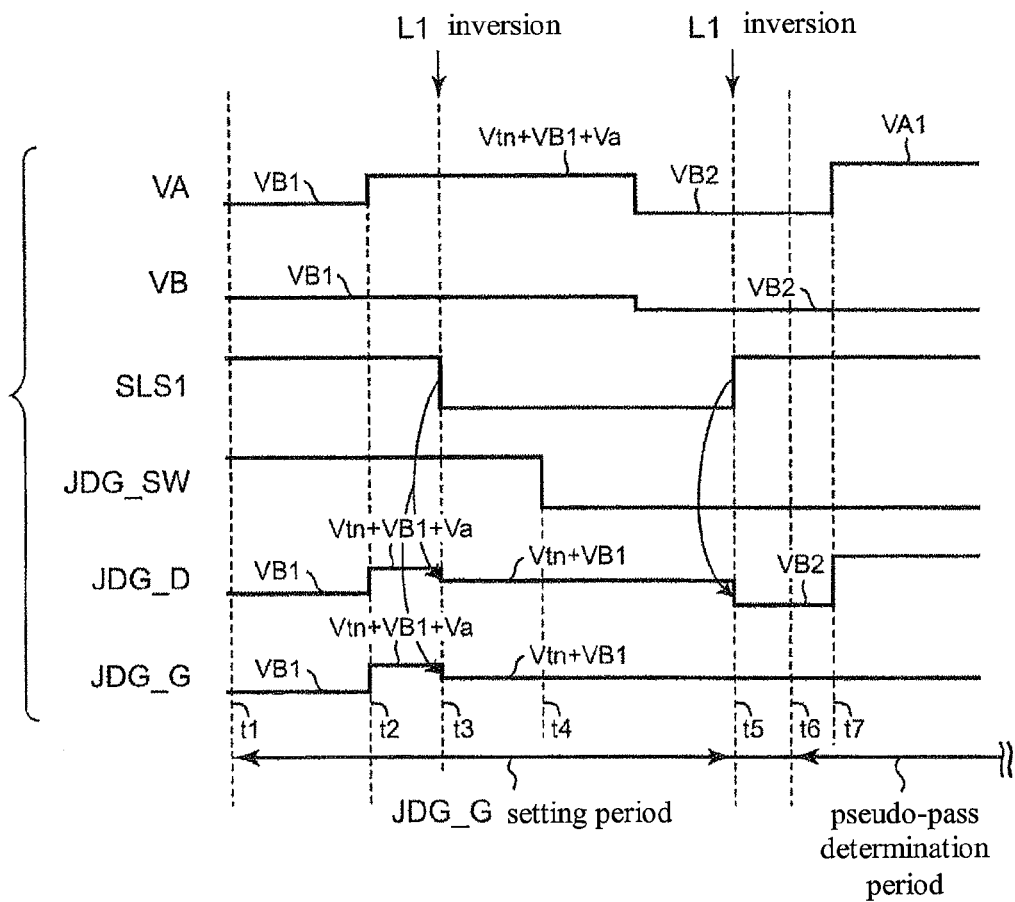
FIG. 8 is a flowchart of each signal showing the operation of the programming end determination part 30n in FIG. 7.

FIG. 8 is a timing diagram of each signal showing the operation of the programming end determination part 30*n* in FIG. 7. In FIG. 8, a setting period of the gate voltage JDG_G is from the time t1 to the time t5, a pseudo-pass determination period is after the time t6. A first control voltage value VB1 is a positive voltage around 0 V, e.g. 0.1 V, for example, and a value of over drive is set to a predetermined value.

Further, a second control voltage value VB2 is a voltage of 0 V or around 0 V, for example, and is lower than the control voltage VB1. Preferably, it is set that VB1−VB2=0.1 V. At the time t7, when the signal line A (PBPUP) rises to the voltage VA1, the drain current Id flows between the voltage VA1 of the signal line A (PBPUP) and the voltage VB2 of the signal line B, and determination of programming verification is performed. However, if the voltages satisfy VA1−VB2>VB1−VB2, the MOS transistor TJDG operates in the saturation region, and the drain current Id is determined by Vgs−Vth=VB1−VB2, as described above. Thus, the drain current Id may be set to a suitable value by the voltage difference VB1−VB2.

In FIG. 8, between the time t2 and the time t4 when the MOS transistor TGC is turned on, the signal line A is applied with a voltage higher than Vtn+VB1. The node SLS1 of the page buffer PBn of the memory cell that does not pass the verification is at the high level. Because the MOS transistor TJn is turned on, the gate voltage JDG_G of the MOS transistor TJDG becomes this level. At the time t2, when the voltage VA of the signal line A changes, the drain voltage JDG_D and the gate voltage JDG_G change from the first control voltage value VB1 to the voltage Vtn+VB1+Va accordingly. (To be more accurate, because current flows through the MOS transistor TGC, a voltage drop Vds occurs between the drain and source, and therefore it is Vtn+VB1+Va−Vds) Here, Vtn+Va represents the voltage drop amount when the MOS transistor TJDG performs diode connection (when the MOS transistor TGC is turned on). Then, at the time t3, when the data of the latch L1 is inverted, the MOS transistor TJn of the page buffer PBn that does not pass is turned off and blocked. Meanwhile, the gate voltage JDG_G of the MOS transistor TJDG becomes the voltage (Vtn+VB1). Following that, at the time t4, the determination control signal JDG_SW becomes the low level and the gate of the MOS transistor TJDG becomes floating, but the gate voltage JDG_G remains the voltage (Vtn+VB1). Then, at the time t5, when the data of the latch L1 is inverted, the drain voltage JDG_D of the MOS transistor TJDG becomes the voltage VB2 because the MOS transistor TJn is turned on again. Thereafter, at the time t7, the signal line A (PBPUP) is raised to the voltage VA1 and the determination of programming verification is performed.

Next, in order to evaluate the effects of the above embodiment, inventors of the invention used a SPICE (Simulation Program with Integrated Circuit Emphasis) model to calculate the drain current Id through simulation based on the conditions of fast, typical, and slow. The results are shown in FIG. 9 to FIG. 10 and Table 1.

TABLE 1

|  | First embodiment Example 1 V(JDG_G) = Vth + 0.1 V | First embodiment Example 2 V(JDG_G) = Vth + 0.2 V | Conventional Example 5 μA typical |
| --- | --- | --- | --- |
| Id maximum(μA) | 2.8 | 6.0 | 9.4 |
| Id minimum(μA) | 2.5 | 5.2 | 2.3 |
| ΔId/Id_typical | 12% | 15% | 142% |

Figure 3:
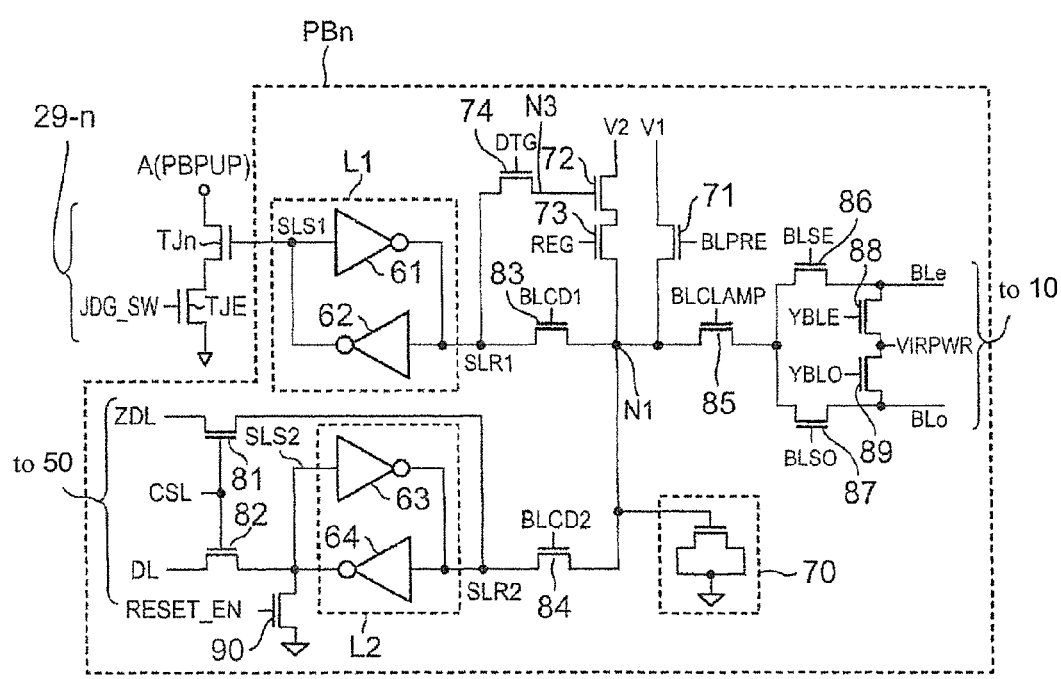
FIG. 3 is a circuit diagram showing an exemplary structure of the page buffer PBn and the programming end determination part 29-n of FIG. 2.
Figure 9:
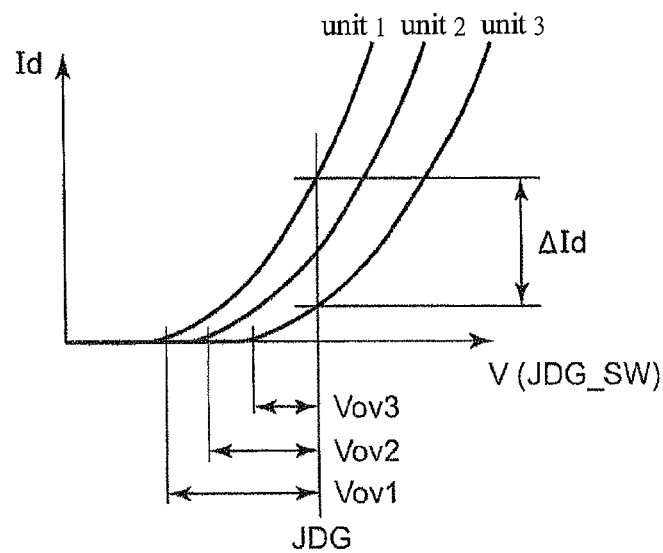
FIG. 9 is a diagram showing the deviation of the drain current Id when the gate voltage is set to the fixed value JDG in the chart that shows a characteristic of the gate voltage V (JDG_SW) with respect to the drain current Id of the MOS transistor TJE of the conventional programming end determination part 29-n of FIG. 3.
Figure 10:
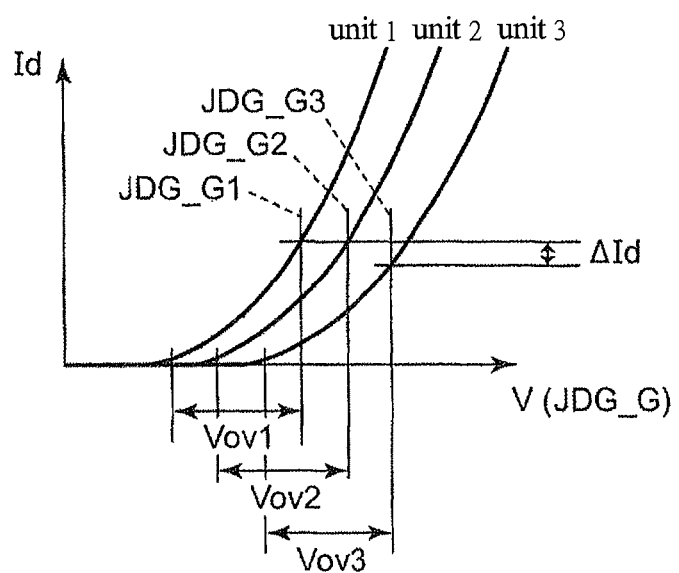
FIG. 10 is a diagram showing the deviation of the drain current Id when the gate voltage is set to Vth+the fixed value in the chart that shows a characteristic of the gate voltage V (JDG_G) with respect to the drain current Id of the MOS transistor TJDG of the programming end determination part 30*n* of the first embodiment in FIG. 7.

FIG. 9 is a diagram showing the deviation of the drain current Id when the gate voltage of the MOS transistor TJE is set to the fixed value JDG in the chart that shows a characteristic of the gate voltage V (JDG_SW) with respect to the drain current Id of the MOS transistor TJE of the conventional programming end determination part 29-n of FIG. 3. FIG. 10 is a diagram showing the deviation of the drain current Id when the gate voltage of the MOS transistor TJDG is set to Vth+the fixed value in the chart that shows a characteristic of the gate voltage JDG_G with respect to the drain current Id of the MOS transistor TJDG of the programming end determination part 30n of the first embodiment in FIG. 7. Table 1 shows the maximum and minimum of the drain current Id in the conventional example and examples 1 and 2 of the first embodiment. In addition, the simulation conditions are as follows.

(1) MOS transistor size: W/L=0.5/0.3;
(2) drain voltage Vd=2.2 V;
(3) temperature T=25° C.;
(4) SPICE model, fast/typical/slow; and
(5) Vth(1 μA)=0.66 V typical.

Besides, because there is a large deviation between the SPICE models, in Table 1, the circuit of the conventional example has a very large deviation, but the actual deviation of the MOS transistor is far smaller compared to the SPICE model. The reason is that the conditions of the SPICE model correspond to the deviation of all MOS transistors between the lots, wafers, chips, and in the chips; however, in this circuit (the programming end determination part for programming verification), the deviation that causes a problem only occurs in the chips.

It is explicitly known from FIG. 9, FIG. 10 and Table 1 that in examples 1 and 2 of the present embodiment, as compared with the conventional example, the deviation of the drain current Id is significantly reduced in comparison with the difference between the fast/typical/slow models. The security level of the flash memory manufactured by the applicant in the conventional example is the level of (3, 4) determination, and the deviation of the average drain current Id of each transistor can be calculated as about 10%-15%. As a result, this embodiment shows that, in one semiconductor chip, the deviation of the drain current Id is improved to 1/10 compared to the conventional example, and may be improved to a deviation of 1%-1.5%. The level indicates that, for pseudo-pass bits of 10 bits or more, the pseudo-pass determination is performed with high accuracy.

Figure 11:
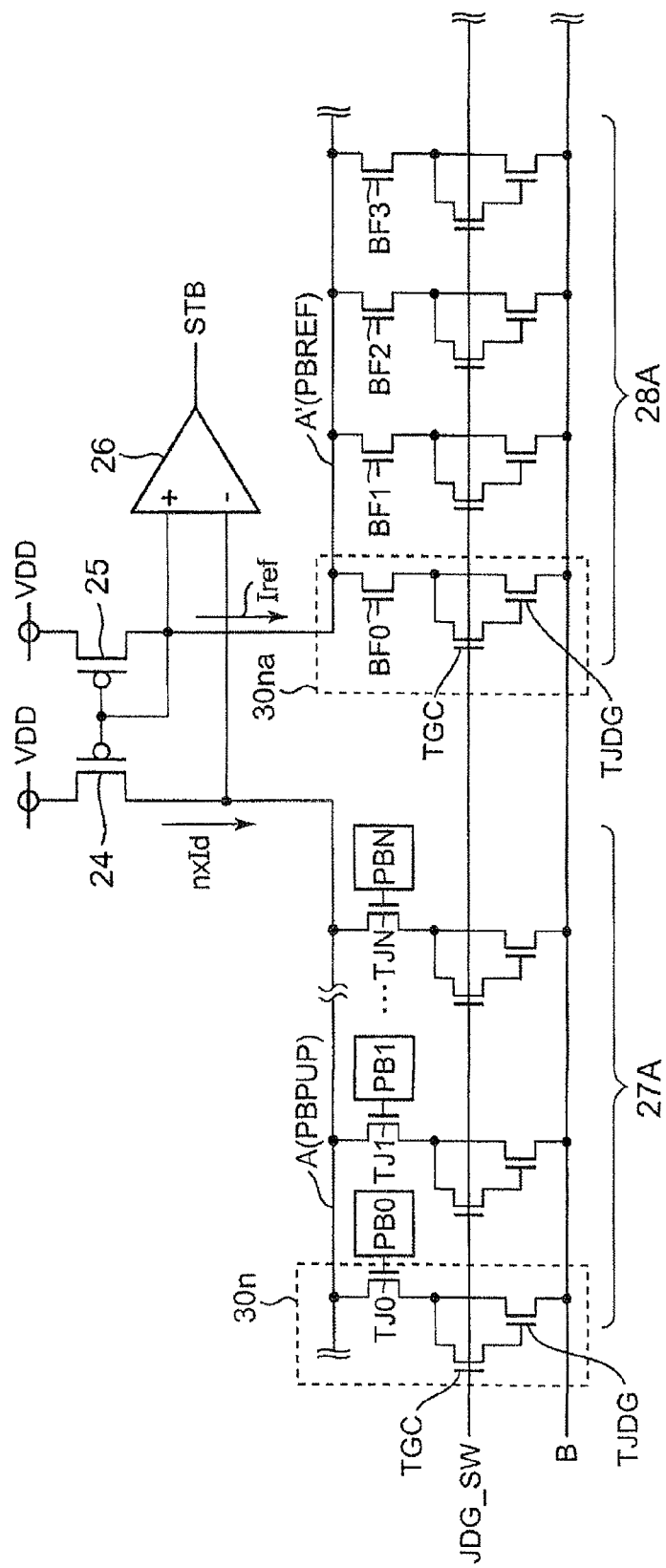
FIG. 11 is a circuit diagram showing an exemplary structure of a programming end detection circuit 16AA for pseudo-pass determination in the NAND flash EEPROM of the first embodiment.

FIG. 11 is a circuit diagram showing an exemplary structure of a programming end detection circuit 16AA for pseudo-pass determination in the NAND flash EEPROM of the first embodiment. The programming end detection circuit 16AA of FIG. 11 is different from the programming end detection circuit 16A of FIG. 4 in the following aspects.

Figure 4:
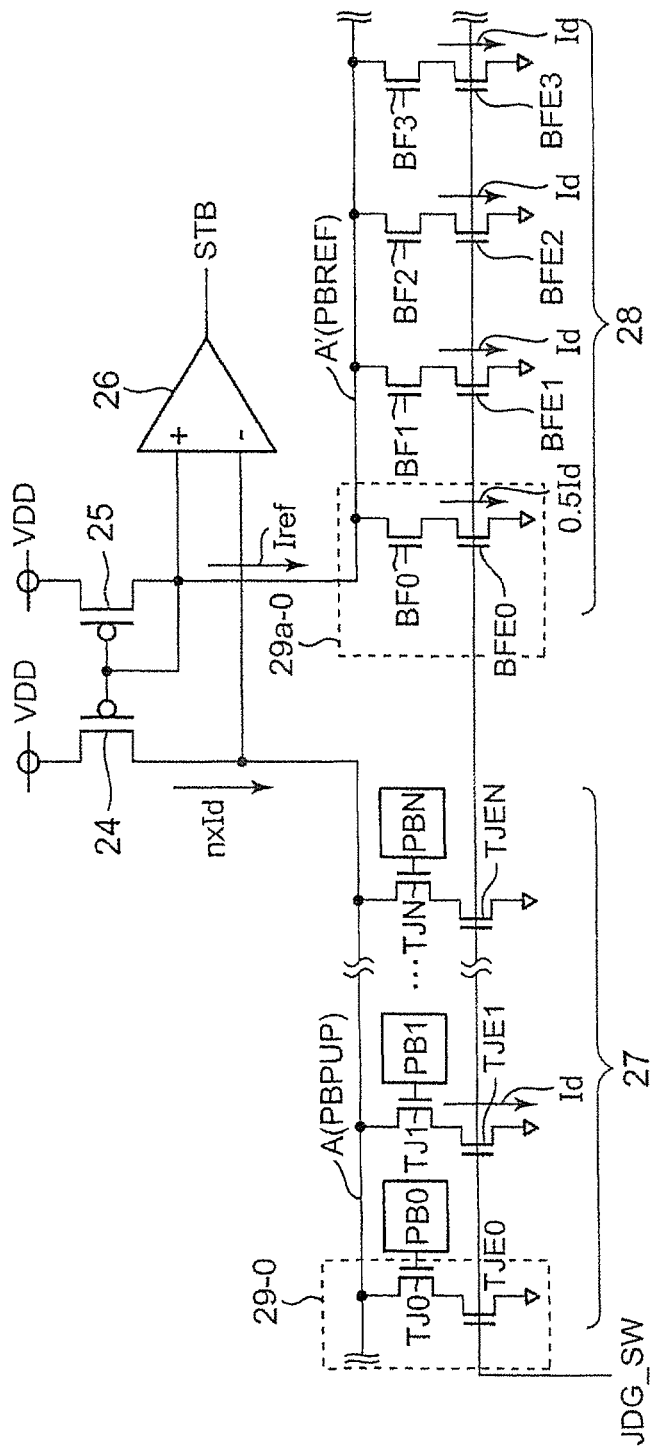
FIG. 4 is a circuit diagram showing an exemplary structure of the programming end detection circuit 16A for pseudo-pass determination in the NAND flash EEPROM of FIG. 1A.
Figure 5:
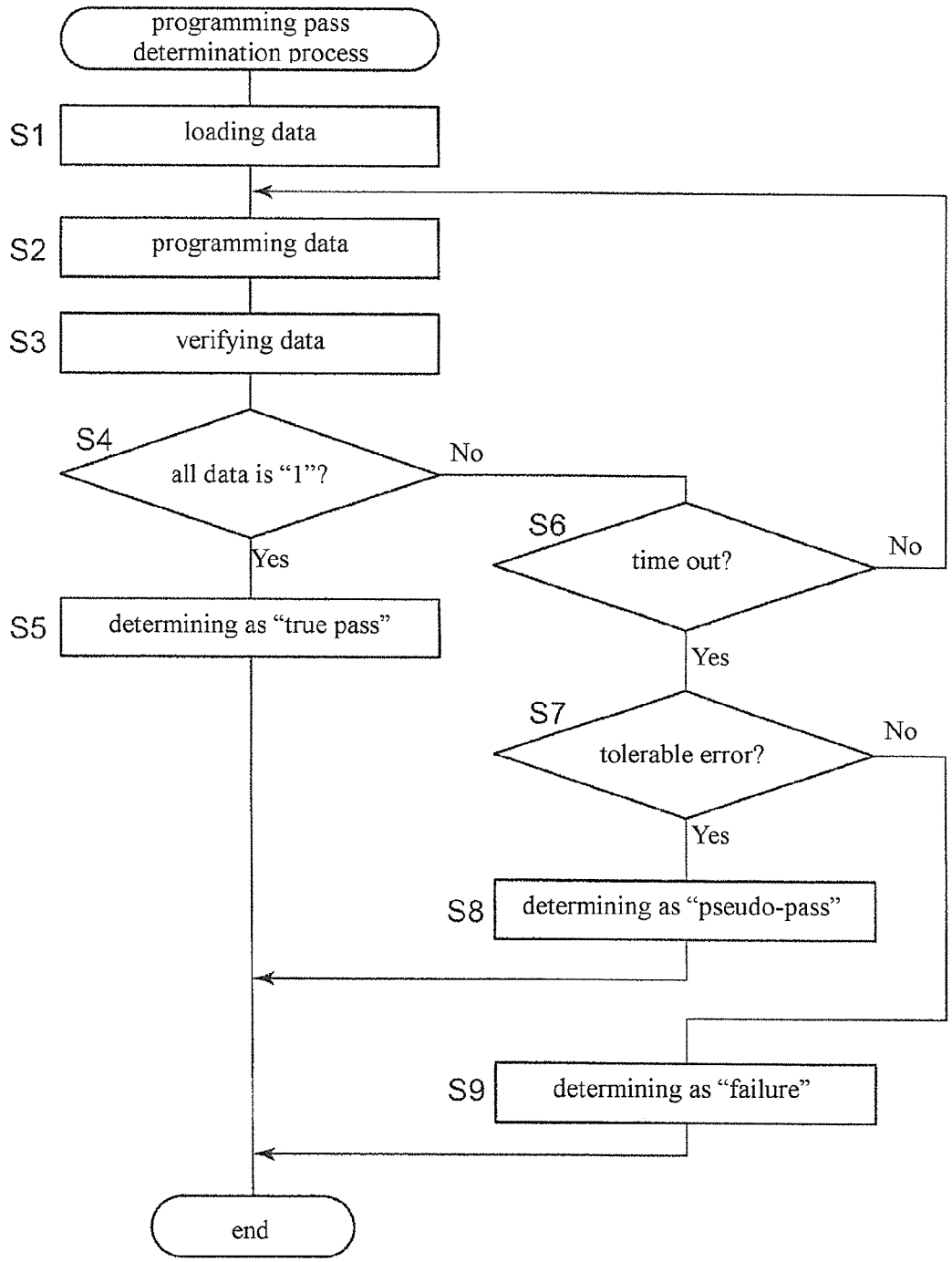
FIG. 5 is a flowchart showing the programming pass determination process of the NAND flash EEPROM of FIG. 1A.
Figure 6:
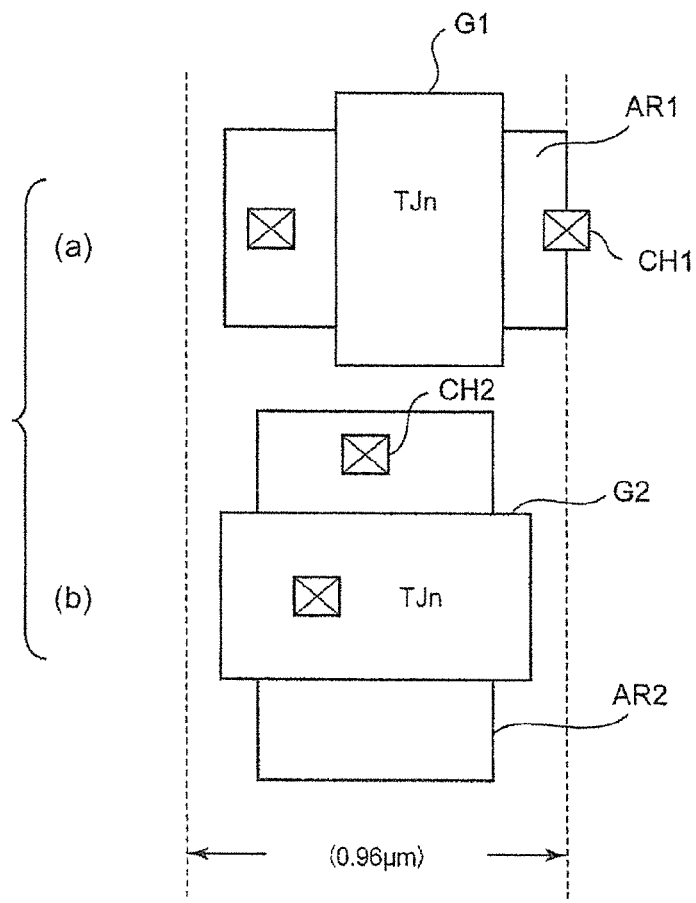
FIG. 6 is a plan view showing an exemplary configuration of the MOS transistors that constitute the page buffer PBn and the programming end determination part 29-n of FIG. 3. Part (a) of FIG. 6 is a plan view of disposing the gate in the direction of the bit line. Part (b) of FIG. 6 is a plan view of disposing the gate perpendicularly to the bit line.

(1) The programming end determination part 30n (FIG. 7) is provided in the programming end determination circuit 27A in place of the programming end determination part 29-n of the programming end determination circuit 27 of FIG. 4.

(2) A reference voltage generation part 30na (replica circuit of the programming end determination part 30n) is provided in the reference voltage generation circuit 28A in place of the reference voltage generation part 29a-n (replica circuit of the programming end determination part 29-n) of the reference voltage generation circuit 28 of FIG. 4.

On the left side of FIG. 11, the programming end determination circuit 27A including a plurality of (i.e. N+1) programming end determination parts 30n is disposed, and on the signal line A (PBPUP), a drain current n×Id, which is n times the drain current Id, flows through the MOS transistor 24 from the power voltage VDD, wherein n is an integer. The integer n is the number of the circuits 30n through which the drain current Id flows and is equivalent to the number of the memory cells that have not passed the programming verification. Further, the reference voltage generation circuit 28A on the right side of FIG. 11 includes a plurality of (i.e. J+1) reference voltage generation parts 30na and is formed by a plurality of MOS transistors (BFj and the TGC and TJDG connected thereto) connected between the signal line A' (PBREF) and the signal line B (here, j=0, 1, . . . J; and J is a positive integer). Here, the MOS transistor TJDG connected to the MOS transistors BF1, BF2, . . . , other than the MOS transistor BF0, is a replica circuit. In order that the current Id flowing through the replica circuit MOS transistors BFE1-BFEJ is the same as the drain current Id of the circuit 30n, the transistor sizes of the MOS transistors TJDG and the applied voltages are set completely equal. The sizes of the MOS transistor BF0 and the MOS transistors TGC and TJDG connected thereto or the gate voltage are controlled such that the drain current flowing through the MOS transistor BF0 and the MOS transistors TGC and TJDG connected thereto is 0.5×Id. Moreover, in the signal line PBREF, the threshold reference current Iref flows through the MOS transistor 25 from the power voltage VDD. The threshold reference current Iref is a sum of the unit reference current applied by each reference current generation part that respectively includes a group of MOS transistors (BF0 and the TGC and TJDG connected thereto, BF1 and the TGC and TJDG connected thereto, BF2 and the TGC and TJDG connected thereto . . . ).

In addition, corresponding to the number n of the turn-on MOS transistors TJn in the programming end determination circuit 27A, while a voltage corresponding to the drain current n×Id flowing through the MOS transistor 24 is applied to the inverted input terminal of the comparator 26, a voltage corresponding to the threshold reference current Iref flowing through the MOS transistor 25 is applied to the non-inverted input terminal of the comparator 26, and the comparator 26 outputs the status signal STB at low level when n×Id<Iref. That is, for the MOS transistor BFj and the TGC and TJDG connected thereto of the J+1 group through which the threshold reference current Iref flows (j=0, 1, . . . J), when the number N of the memory cells that do not pass the programming verification is smaller than or equal to J (J≥N) the status signal STB becomes the low level and it is determined as "pseudo-pass". For example, when J=2, the threshold reference current Iref is 2.5×Id (Iref=2.5×Id). Therefore, the drain current N×Id flowing through the programming end determination circuit 27A is pseudo-pass due to N≤2.

As described above, according to this embodiment, the process of programming verification determination is performed with high accuracy even if the transistor of the peripheral circuit, e.g. page buffer, is small due to shrink of the pitch of the memory cells that results from miniaturization of the non-volatile memory apparatus, such as a NAND flash memory.

Figure 12:
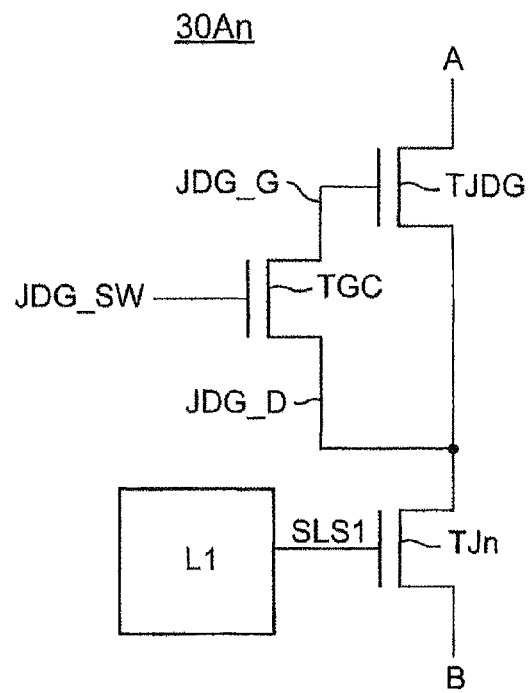
FIG. 12 is a circuit diagram showing the structure of the programming end determination part 30An in a modified example of the first embodiment.

FIG. 12 is a circuit diagram showing the structure of a programming end determination part 30An in a modified example of the first embodiment. In comparison with the programming end determination part 30n of the first embodiment of FIG. 7, the programming end determination part 30An of FIG. 12 is characterized in that: the MOS transistors TJn, TGC, and TJDG between the signal line A and the signal line B are connected in a reverse order, i.e. the order of TJDG, TGC, and TJn. The programming end determination part 30An operates in the same manner and achieves the same effects except that the relation between the voltages of the signal line A and the signal line B is reversed during the voltage JDG_G setting period of FIG. 8.

In the first embodiment and the modified example thereof, the N channel MOS transistor TJn may be changed to a P channel MOS transistor TJn. Moreover, in the first embodiment and the modified example thereof, the N channel MOS transistor TGC may be changed to a P channel MOS transistor TGC or a transmission gate. But, the determination control signal JDG_SW is required to change from high enable to low enable. The foregoing are referred to as "other modified examples."

Figure 13:
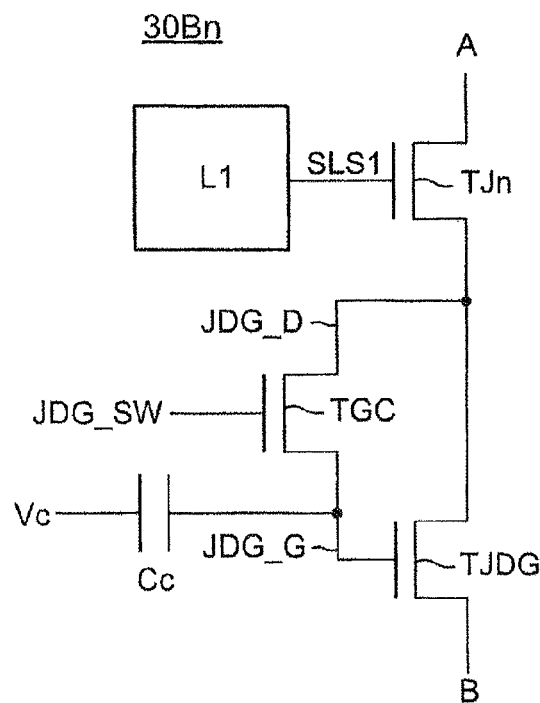
FIG. 13 is a circuit diagram showing the structure of the programming end determination part 30Bn in another modified example of the first embodiment.

FIG. 13 is a circuit diagram showing the structure of a programming end determination part 30Bn in another modified example of the first embodiment. In comparison with the programming end determination part 30n of the first embodiment of FIG. 7, the programming end determination part 30Bn of another modified example in FIG. 13 is characterized in that: the gate of the MOS transistor TJDG is applied with a control voltage Vc through a coupling capacitor Cc. Here, the control voltage Vc is applied during the pseudo-pass determination period, and the drain current Id is adjustable through rise of the gate voltage JDG_G due to coupling. Furthermore, invention particulars of the another modified example may also be applied to the first embodiment and the modified example 1 thereof.

In addition, the first embodiment and the modified example thereof may also be modified as described below. The N channel MOS transistor may be set as a P channel MOS transistor.

Second Embodiment

Figure 14:
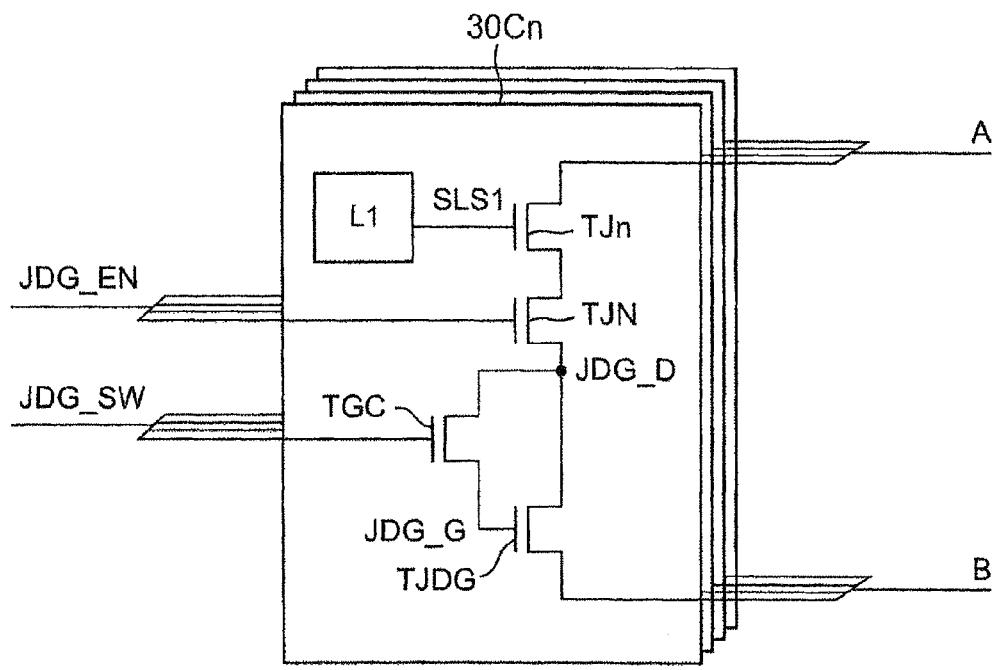
FIG. 14 is a circuit diagram showing the structure of the programming end determination part 30Cn of the second embodiment.

FIG. 14 is a circuit diagram showing the structure of a programming end determination part 30Cn of the second embodiment. The programming end determination part 30Cn of the second embodiment is different from the programming end determination part 30n of the first embodiment of FIG. 7 in the following aspects.

(1) The programming end determination part 30Cn is characterized in that: the MOS transistor TJN for determination operation enable control switch is inserted between the MOS transistor TJn and the MOS transistor TJDG, and the gate of the MOS transistor TJN for determination operation enable control switch is applied with the determination enable signal JDG_EN that becomes low level during the voltage JDG_G setting period of programming verification. During the latch L1 inversion period between t3-t5 of FIG. 8, the signal is set to low level.

In FIG. 14, the pass of the drain current Id is cut. Thus, in addition to the effects of the first embodiment, the inversion operation of the latch L1 is not required and the sequence structure is simplified.

Further, the MOS transistor TJN for determination operation enable control switch may be inserted between the signal line A and the MOS transistor TJn. The MOS transistor TJN for determination operation enable control switch is not necessarily an N channel MOS transistor and may be a P channel MOS transistor.

Figure 15:
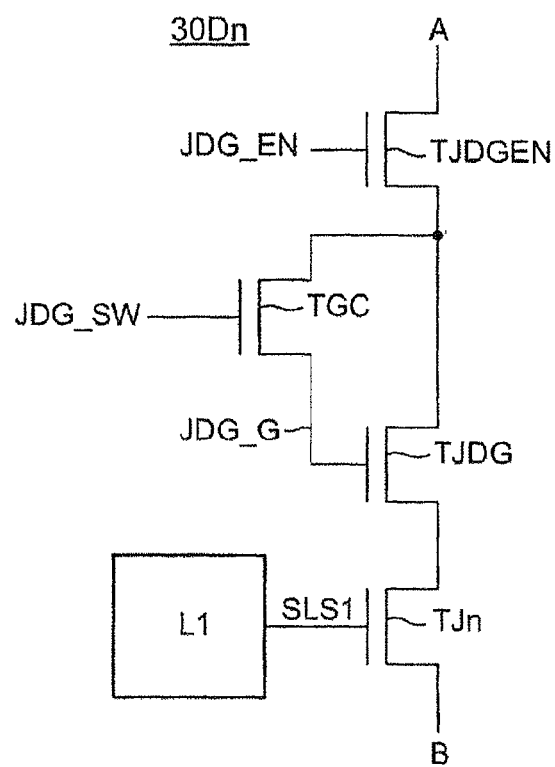
FIG. 15 is a circuit diagram showing the structure of the programming end determination part 30Dn in a modified example of the second embodiment.

FIG. 15 is a circuit diagram showing the structure of a programming end determination part 30Dn in a modified example of the second embodiment. In comparison with the programming end determination part 30n of the first embodiment of FIG. 7, the programming end determination part 30Dn in the modified example of FIG. 15 is characterized in that: the connection order of the MOS transistors TJn, TGC, and TJDG between the signal line A and the signal line B is changed to a connection order of TGC, TJDG, and TJn. Between the signal line A and the MOS transistor TJDG, a MOS transistor TJDGEN controlled by the determination enable signal JDG_EN is inserted and connected. The programming end determination part 30Dn having the aforementioned configuration is able to cut the drain current Id.

Thus, in addition to the effects of the first embodiment, the inversion operation of the latch L1 is not required and the sequence structure is simplified.

Figure 16:
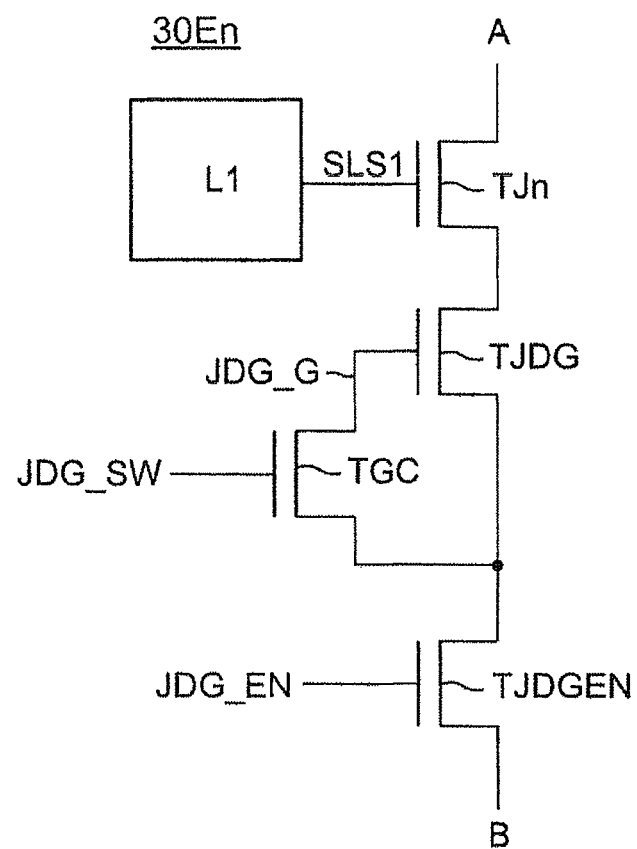
FIG. 16 is a circuit diagram showing the structure of the programming end determination part 30En in another modified example of the second embodiment.

FIG. 16 is a circuit diagram showing the structure of a programming end determination part 30En in another modified example of the second embodiment. In comparison with the programming end determination part 30An in the modified example of the first embodiment of FIG. 12, the programming end determination part 30En in the another modified example of FIG. 16 is characterized in that: the connection order of the MOS transistors TJDG, TGC, and TJn between the signal line A and the signal line B is changed to a connection order of TJn, TJDG, and TGC. And, between the signal line B and the MOS transistor TJDG, the MOS transistor TJDGEN controlled by the determination enable signal JDG_EN is inserted and connected. The programming end determination part 30En having the aforementioned configuration is able to cut the drain current Id. Thus, in addition to achieving the same effects as the programming end determination part 30An, the programming end determination part 30En does not require the inversion operation of the latch L1 and the sequence structure is simplified.

Third Embodiment

Figure 17:
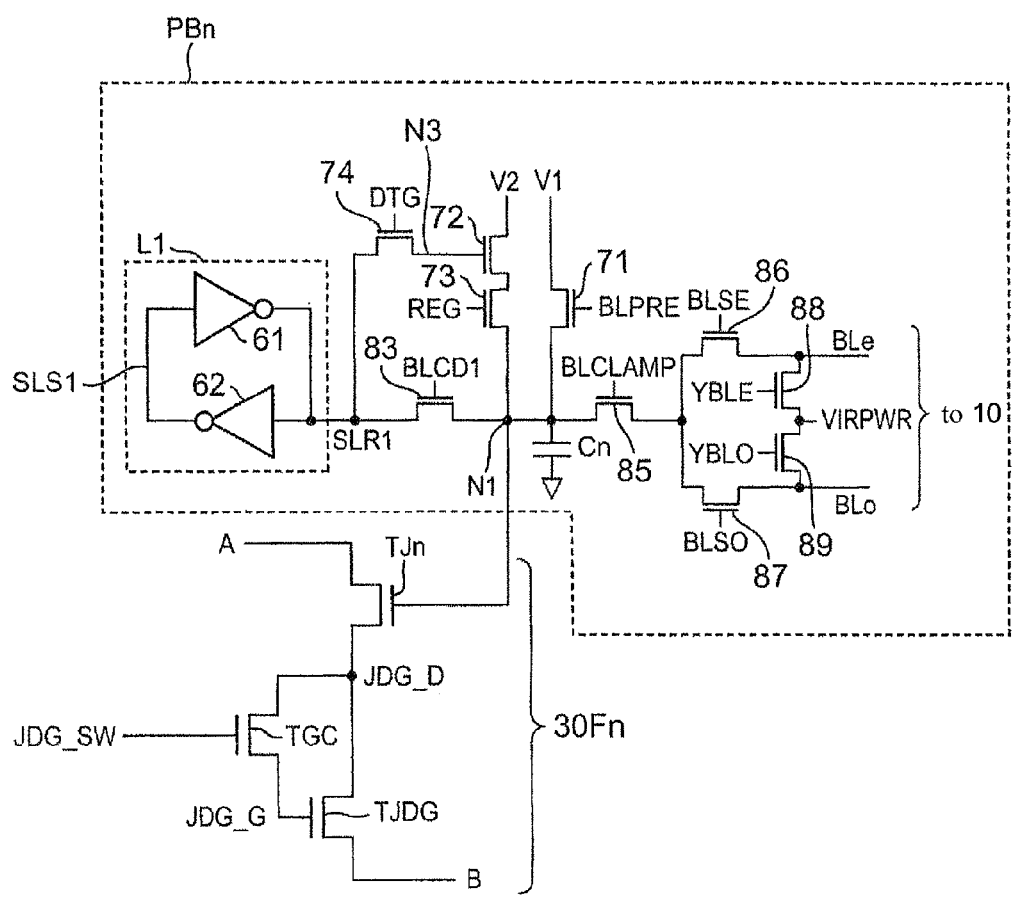
FIG. 17 is a circuit diagram showing the structure of the programming end determination part 30Fn and the page buffer PBn of the third embodiment.

FIG. 17 is a circuit diagram showing the structure of a programming end determination part 30Fn and the page buffer PBn of the third embodiment. The gate of the MOS transistor TJn of the programming end determination part 30n in the first embodiment is connected to the node SLS1 of the latch L1 of the page buffer PBn in FIG. 3. In contrast thereto, in the third embodiment, as shown in FIG. 17, the gate of the MOS transistor TJn of the programming end determination part 30Fn may be connected to the node N1 of the page buffer PBn.

In this embodiment, the operation of inversion of the latch L1 during the voltage JDG_G setting period in FIG. 8 may be omitted without particularly adding a MOS transistor. Here, first, the node capacitor Cn connected to the node N1 is charged to VDD by the power voltage V1. Then, by setting the gate control voltage DTG of the MOS transistor 74 to high level, the data of the data retention node SLR1 of the latch L1 is reflected to the node N3, and when V2=0 V and the gate control voltage REG of the MOS transistor 73 is set to high level to turn on the MOS transistor 73, the voltages of the node N1 and the node SLS1 are the same. Therefore, except for the inversion operation of the latch L1, the operation of this embodiment is the same as the control sequence of the first embodiment. Moreover, to replace the data inversion of the latch L1, the node N1 is V1=0 V, the bit line precharging control voltage BLPRE is set to high level, and the MOS transistor 71 is turned on, so as to discharge the node capacitor Cn, such that N1 becomes 0 V and the MOS transistor TJn is turned off and blocked.

As described above, except that the inversion operation of the latch L1 is omitted by changing the connection target of the gate of the MOS transistor TJn as shown in FIG. 17, this embodiment achieves the same effects as the first embodiment.

Fourth Embodiment

Figure 18:
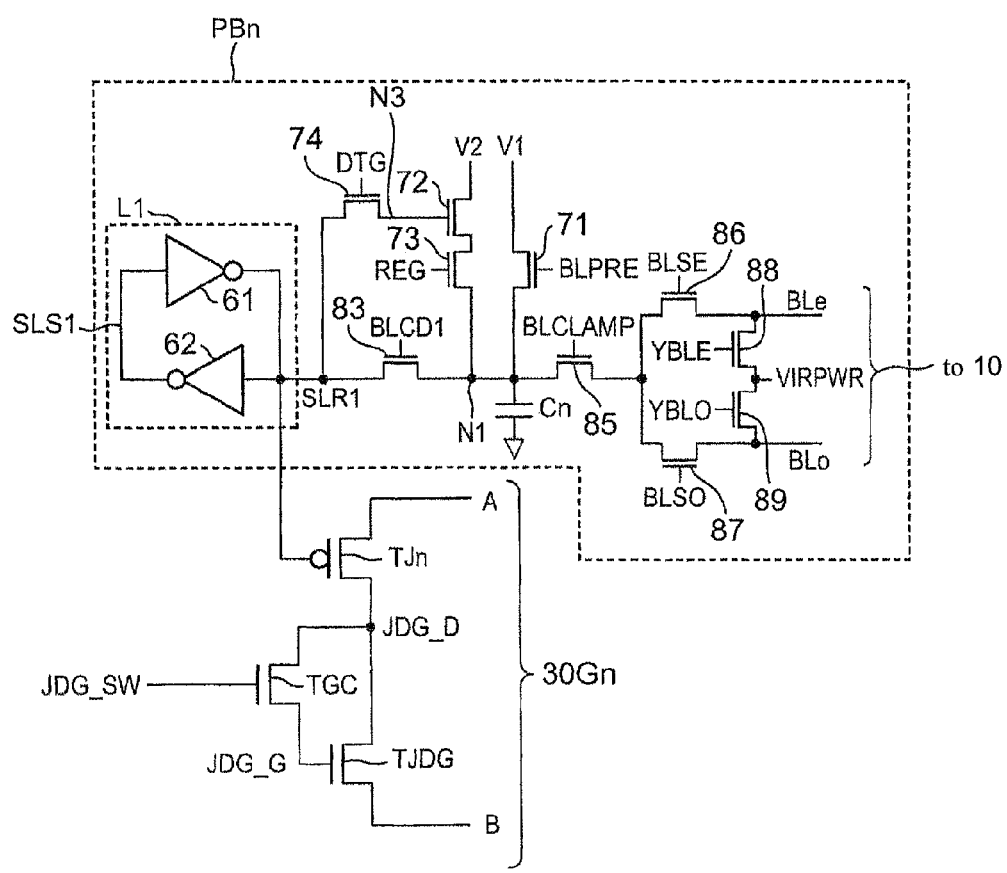
FIG. 18 is a circuit diagram showing the structure of the programming end determination part 30Gn and the page buffer PBn of the fourth embodiment.

FIG. 18 is a circuit diagram showing the structure of a programming end determination part 30Gn and the page buffer PBn of the fourth embodiment. The fourth embodiment of FIG. 18 is different from the third embodiment of FIG. 17 in the following aspects.

(1) A P channel MOS transistor TJn is used in place of an N channel MOS transistor TJn.

(2) The gate of the MOS transistor TJn is connected to the data retention node SLR1 of the latch L1.

The operation of this embodiment is the same as the first embodiment except for the difference.

Fifth Embodiment

Figure 19:
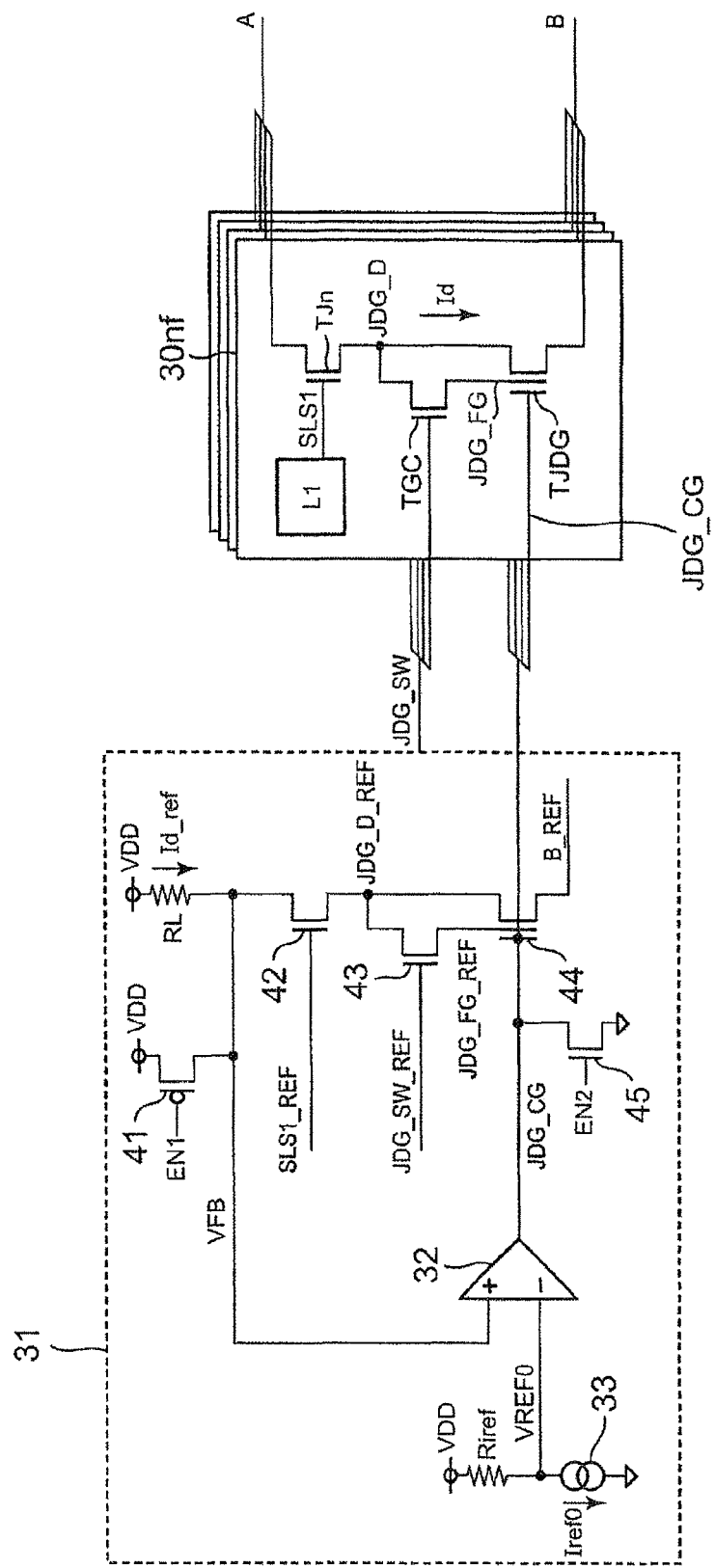
FIG. 19 is a circuit diagram showing an exemplary structure of the reference current generation circuit 31 and the programming end determination part 30*nf* of the fifth embodiment.

FIG. 19 is a circuit diagram showing an exemplary structure of the reference current generation circuit 31 and the programming end determination part 30nf of the fifth embodiment. The programming end determination part 30nf of the fifth embodiment is different from the first embodiment of FIG. 7 in the following aspects.

(1) A stack gate type MOS transistor including a control gate and a floating gate is used as the MOS transistor TJDG.

(2) The floating gate (with voltage set to JDG_FG) of the MOS transistor TJDG is connected to the source of the MOS transistor TGC.

(3) The control gate of the MOS transistor TJDG is applied with the control signal JDG_CG from the reference current generation circuit 31.

In FIG. 19, the reference current generation current 31 is the same as the conventional reference current generation circuit and includes MOS transistors 41-45, a differential amplifier 32, a resistor RL, a resistor Riref, and a current source 33. Here, a reference drain current Id_ref flows through the resistor RL and a reference current Iref0 flows through the current source 33. In addition, the MOS transistor 44 is the same as the stack gate type MOS transistor TJDG of the programming end determination part 30nf, the MOS transistor 42 is the same as the MOS transistor TJn, and the MOS transistor 43 is the same as the MOS transistor TGC.

As described above, with use of the stack gate type MOS transistor TJDG, the drain current Id is controlled with high accuracy, by which the deviation of the drain current Id is reduced. Basically, the NAND flash memory for example has the structure of the stack gate type MOS transistor and therefore may be formed easily. The control sequence of the fifth embodiment is as follows.

(1) In an initial state, the control gate voltage JDG_CG of the MOS transistor TJDG is equal to 0 V (JDG_CG=0 V) (the differential amplifier 32 is not operating and the MOS transistor 45 is turned on), based on which the floating gate voltage JDG_FG of the MOS transistor TJDG is set to a predetermined reference voltage value TJDG_FG_0. For example, the reference voltage value TJDG_FG_0 is set equal to Vtn+0.1 V, so as to perform setting by the same operation as the first embodiment. Meanwhile, the floating gate voltage JDG_FG_REF of the MOS transistor 44 of the reference current generation circuit 31 is also set to the same voltage value as the reference voltage value TJDG_FG_0 by operating the signals SLS1_REF and JDG_SW_REF in the same manner as the first embodiment. Here, what corresponds to the signal line A is the power voltage VDD. However, it is known from FIG. 8 that there is no problem to use VA=Vth+VB1+Va=VDD instead.

(2) In a control operation state of verification determination, the reference current generation circuit 31 generates the control gate voltage JDG_CG such that Id_ref=Iref0, and the drain current Id of the programming end determination part 30nf is also controlled such that Id=Iref0 (threshold reference current).

TABLE 2

|         | Fifth embodiment Example | Conventional Example |
|---------|--------------------------|----------------------|
| ΔId/Iref0 | 12.8%                  | 101%                 |

Table 2 is a table showing drain current deviation of the conventional example and the programming end determination part 30nf of FIG. 19 of the fifth embodiment. In addition, when the drain current Id=10 µA, same as above, it is set that the first control voltage value VB1=0.1 V and VB2=0 V, for example. It is clearly known from Table 2 that, in comparison with the conventional technology, the drain current Id is adjusted to the predetermined value accurately. Accordingly, the process of programming verification determination is performed with high accuracy even if the transistor of the peripheral circuit, e.g. page buffer, is small due to shrink of the pitch of the memory cells that results from scaling of the non-volatile memory apparatus, such as an NAND flash memory.

Figure 20:
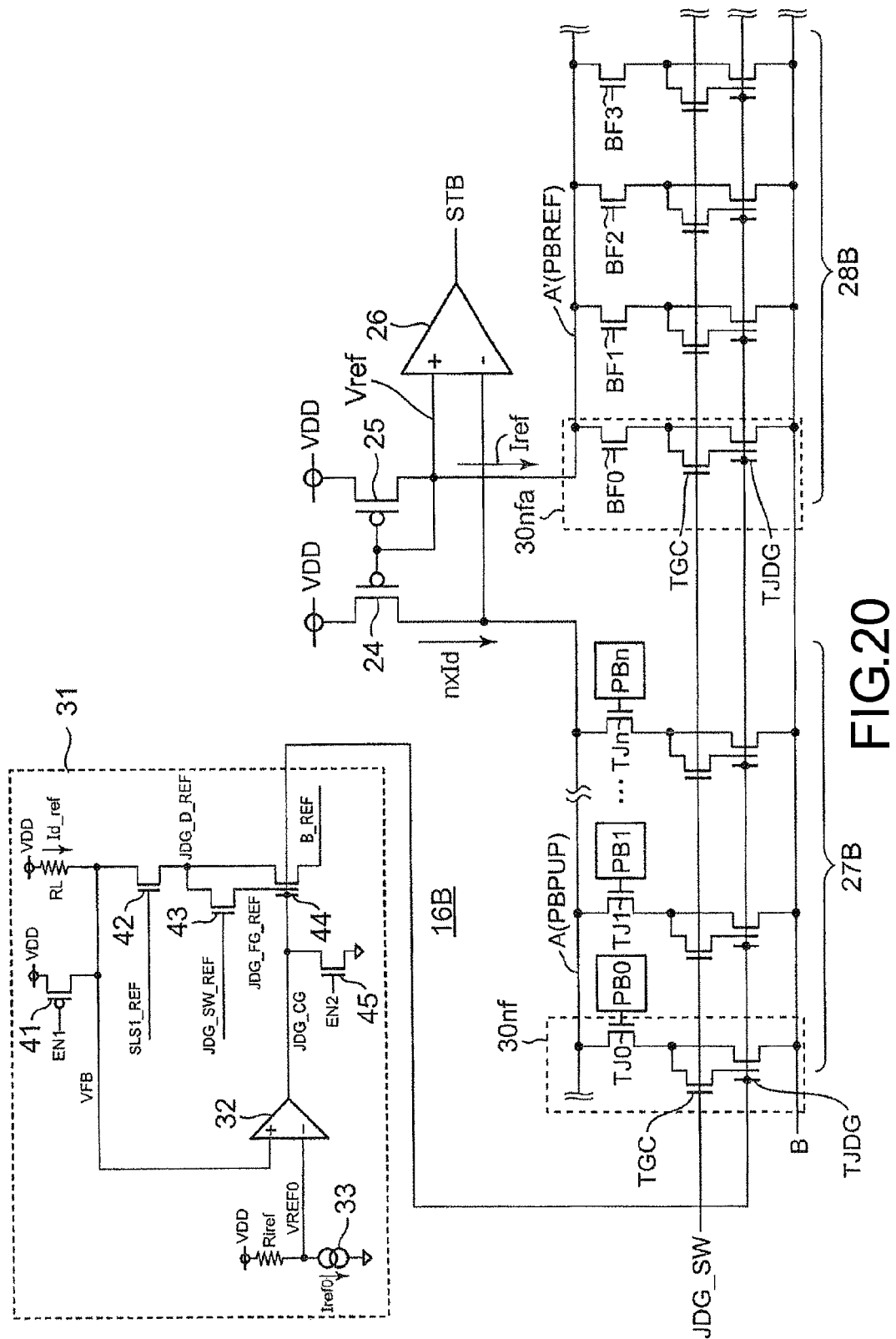
FIG. 20 is a circuit diagram showing an exemplary structure of the programming end detection circuit 16B for pseudo-pass determination in the NAND flash EEPROM of the fifth embodiment.

FIG. 20 is a circuit diagram showing an exemplary structure of the programming end detection circuit 16B for pseudo-pass determination in the NAND flash EEPROM of the fifth embodiment. In FIG. 20, the programming end detection circuit 16B includes: a programming end determination circuit 27B including a plurality of (i.e. N+1) programming end determination parts 30nf and a reference current generation circuit 28B including a plurality of (i.e. J+1) reference current generation parts 30nfa, and operates based on the control gate voltage JDG_CG from the reference voltage generation circuit 31. Here, this embodiment is the same as the first embodiment except for the programming end determination part 30nf and the reference current generation part 30nfa.

Moreover, in the fifth embodiment, the programming end determination part 30nf is not limited to the structure of FIG. 19. The modified example of the first embodiment, the second embodiment, the modified example of the second embodiment, the third embodiment or the fourth embodiment may also be used.

Sixth Embodiment

Figure 21A:
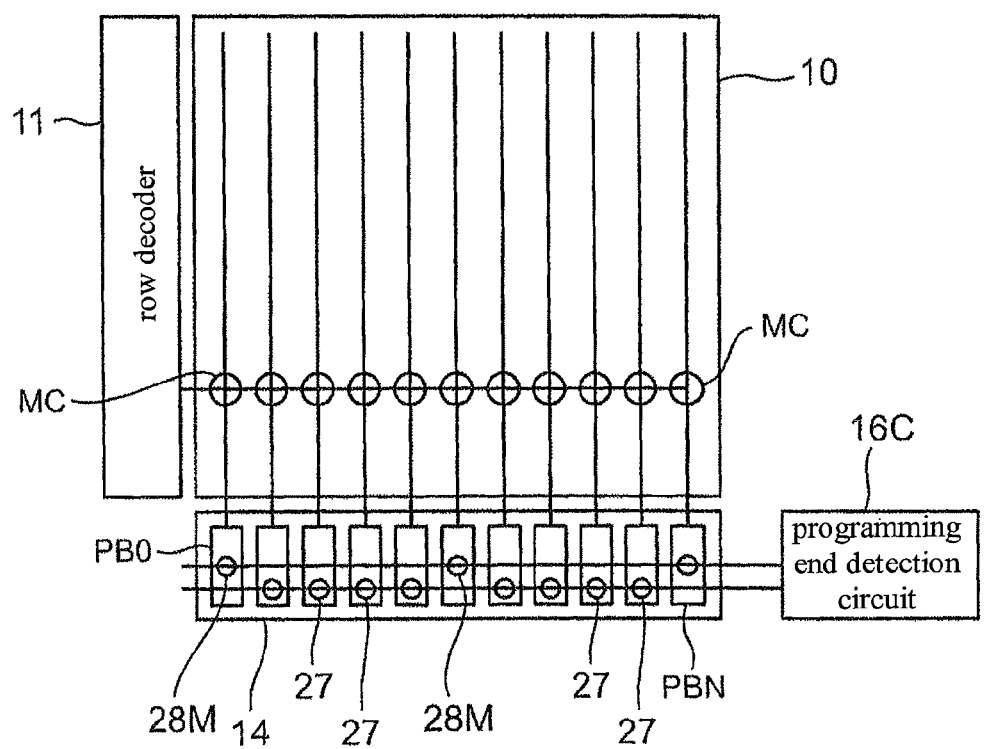
FIG. 21A is a circuit diagram showing the structure of the memory cell array 10 and the peripheral circuit thereof in the sixth embodiment of the invention.
Figure 21B:
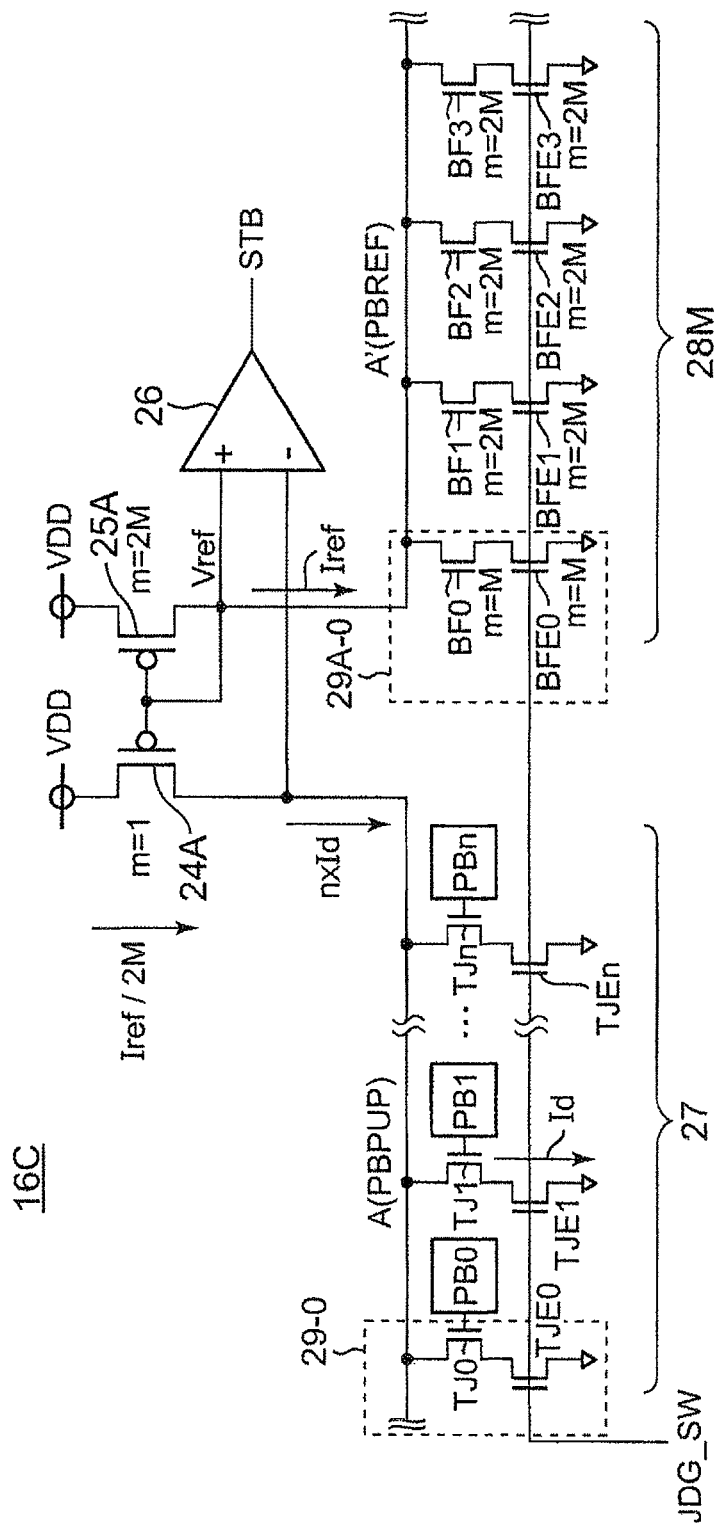
FIG. 21B is a circuit diagram showing the structure of the programming end detection circuit 16C including the programming end determination circuit 27 and the reference current generation circuit 28M for the sixth embodiment of FIG. 21A.

FIG. 21A is a circuit diagram showing the structure of the memory cell array 10 and the peripheral circuit thereof in the sixth embodiment. FIG. 21B is a circuit diagram showing the structure of a programming end detection circuit 16C including the programming end determination circuit 27 and the reference current generation circuit 28M for the sixth embodiment of FIG. 21A. In FIG. 21B, m represents the number of parallel connection of each MOS transistor. In FIG. 21A, each page buffer PBn (n=0, 1, 2, . . . N and N is a positive integer) is provided with the reference current generation circuit 28M for applying the reference current Iref.

In order to generate the reference current Iref of the first embodiment and the fifth embodiment, deviation of the electrical characteristics of the MOS transistor needs to be taken into consideration. Here, the current difference between the reference current Iref and the drain current n×Id that passes or fails the verification is 0.5×Id. Because the current difference is small, sometimes the problem of small margin occurs. Hence, in this embodiment, as shown in FIG. 21B, a plurality of MOS transistors (e.g. 2M MOS transistors) are used to generate the reference current Iref, so as to cancel the deviation of the electrical characteristics of the MOS transistors, wherein M is a positive integer.

In the programming end determination circuit 27 of FIG. 21B, it is characterized in that a MOS transistor 24A is provided to apply the current Iref/2M through the power voltage VDD, and the signal line A (PBPUP) applies the drain current n×Id.

On the other hand, in the reference current generation circuit 28M, a MOS transistor circuit 25A and the MOS transistor 24A constitute a current mirror circuit. The MOS transistor circuit 25A is formed by connecting a plurality of (i.e. 2M) MOS transistors in parallel, such that the threshold reference current Iref flows to generate the reference voltage Vref. Furthermore, the comparator 26 that generates the status signal STB is the same as the first embodiment. Here, the following circuits are connected to the signal line A' (PBREF).

(1) The signal line A' (PBREF) is grounded through the MOS transistor circuit BF0 formed by connecting a plurality of (i.e. M) MOS transistors in parallel and the MOS transistor circuit BFE0 formed by connecting a plurality of (i.e. M) MOS transistors in parallel, and when the MOS transistor circuits BF0 and BFE0 are turned on, a unit reference current (2M×0.5×Id) flows.

(2) The signal line A' (PBREF) is grounded through the MOS transistor circuit BF1 formed by connecting a plurality of (i.e. 2M) MOS transistors in parallel and the MOS transistor circuit BFE1 formed by connecting a plurality of (i.e. 2M) MOS transistors in parallel, and when the MOS transistor circuits BF1 and BFE1 are turned on, a unit reference current (2M×Id) flows.

(3) The signal line A' (PBREF) is grounded through the MOS transistor circuit BF2 formed by connecting a plurality of (i.e. 2M) MOS transistors in parallel and the MOS transistor circuit BFE2 formed by connecting a plurality of (i.e. 2M) MOS transistors in parallel, and when the MOS transistor circuits BF2 and BFE2 are turned on, the unit reference current (2M×Id) flows.

(4) The signal line A' (PBREF) is grounded through the MOS transistor circuit BF3 formed by connecting a plurality of (i.e. 2M) MOS transistors in parallel and the MOS transistor circuit BFE3 formed by connecting a plurality of (i.e. 2M) MOS transistors in parallel, and when the MOS transistor circuits BF3 and BFE3 are turned on, the unit reference current (2M×Id) flows.

Then, all the MOS transistor circuits are formed in the same manner until the MOS transistor circuits BFJ and BFEJ are completed.

As described above, according to this embodiment, each MOS transistor circuit is formed with 2M MOS transistors, except for the MOS transistor circuits BF0 and BFE0. Nevertheless, the generation of the reference voltage Vref is the same as the fifth embodiment. By replacing one MOS transistor with 2M MOS transistors, the deviation of the electrical characteristics of each MOS transistor is averaged to reduce the deviation.

Seventh Embodiment

Figure 22:
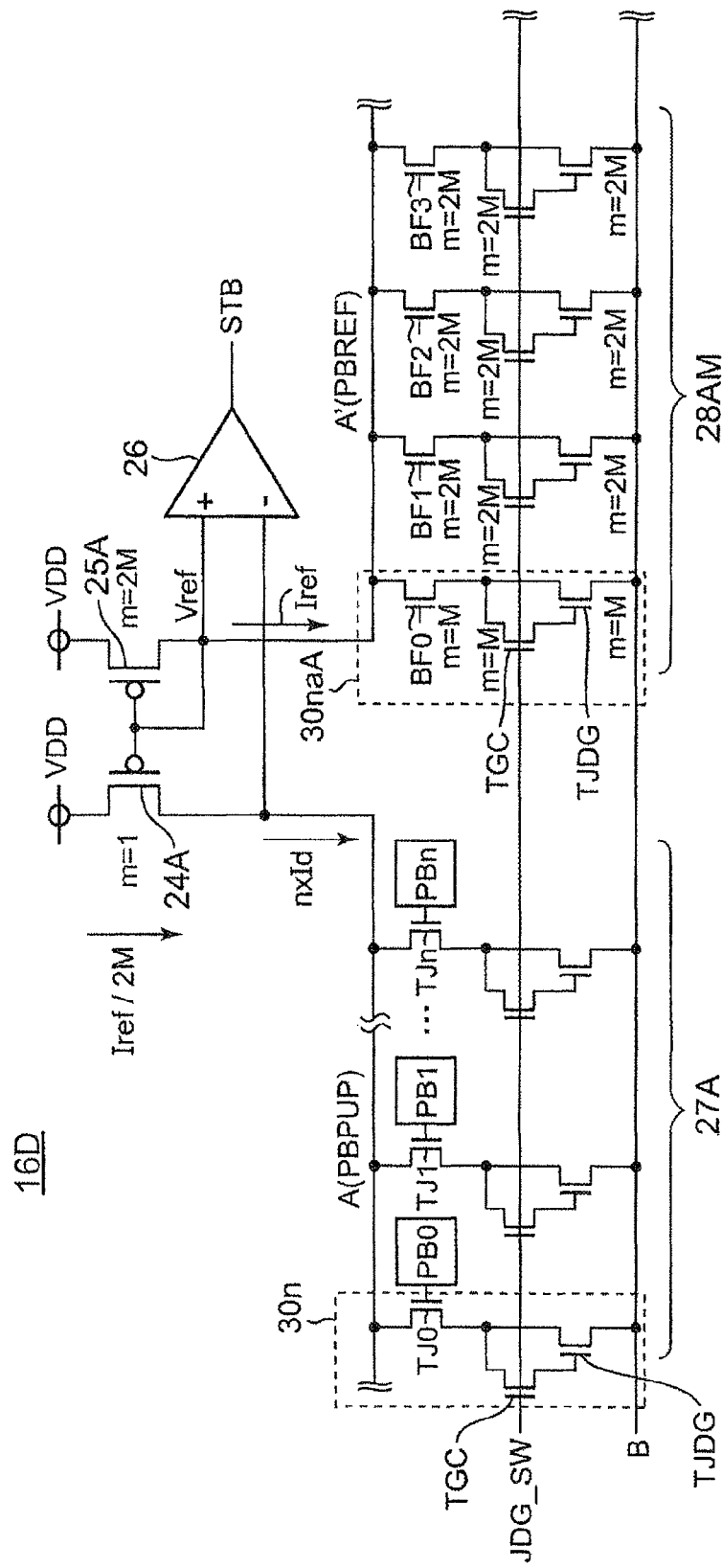
FIG. 22 is a circuit diagram showing the structure of the programming end detection circuit 16D of the seventh embodiment.

FIG. 22 is a circuit diagram showing the structure of a programming end detection circuit 16D of the seventh embodiment. The programming end detection circuit 16D of the seventh embodiment of FIG. 22 is different from the programming end detection circuit 16C of the sixth embodiment of FIG. 21B in the following aspects.

(1) A programming end determination circuit 27A including a plurality of (i.e. N+1) programming end determination parts 30n is provided in place of the programming end determination circuit 27.

(2) A reference current generation circuit 28AM including a plurality of (i.e. J+1) reference current generation parts 30naA is provided in place of the reference voltage generation part 29A-n of the reference current generation circuit 28M. Here, the same as the sixth embodiment, the reference current generation part 30naA is formed by replacing each MOS transistor included therein with a circuit described below. The circuit is formed by connecting a plurality of (i.e. M) MOS transistors (the MOS transistor BF0 and the MOS transistors TGC and TJDG connected thereto) or a plurality of (i.e. 2M) MOS transistors (the MOS transistors BF1, BF2, . . . (other than the MOS transistor BF0) and the MOS transistors TGC and TJDG connected thereto) in parallel.

The seventh embodiment with the aforementioned configuration achieves the effects of the first embodiment and the sixth embodiment.

Eighth Embodiment

Figure 23:
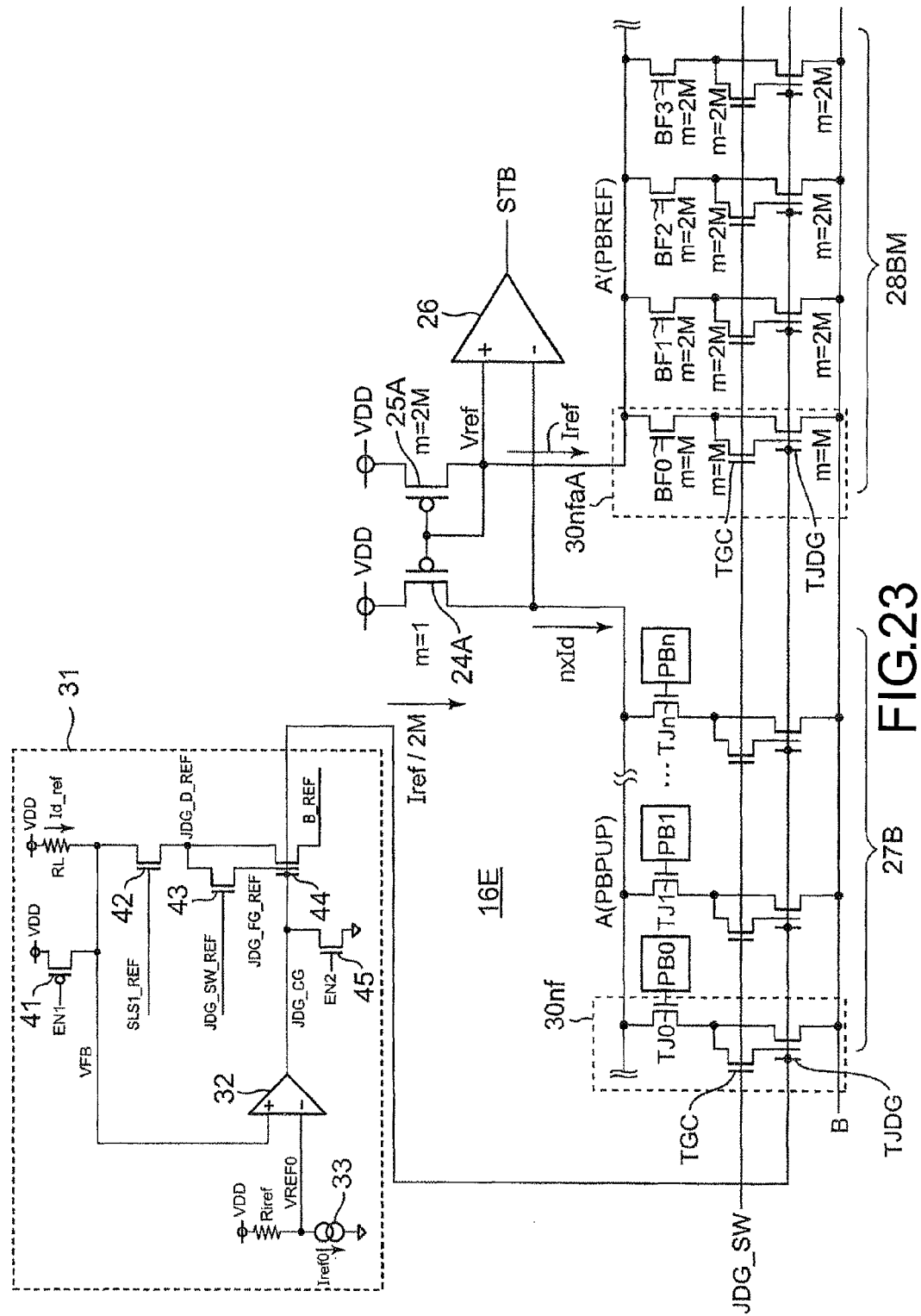
FIG. 23 is a circuit diagram showing the structure of the programming end detection circuit 16E of the eighth embodiment.

FIG. 23 is a circuit diagram showing the structure of a programming end detection circuit 16E of the eighth embodiment. The programming end detection circuit 16E of the eighth embodiment of FIG. 23 is different from the programming end detection circuit 16D of the seventh embodiment of FIG. 22 in the following aspects.

(1) A programming end determination circuit 27B including the programming end determination part 30nf of FIG. 19 is provided in place of the programming end determination part 30n.

(2) A reference current generation circuit 28BM including a reference current generation part 30nfaA is provided in place of the reference voltage generation part 30naA. Here, the same as the sixth embodiment, the reference current generation part 30nfaA is formed by replacing each MOS transistor included therein with a circuit described below. The circuit is formed by connecting a plurality of (i.e. M) MOS transistors (the MOS transistor BF0 and the MOS transistors TGC and TJDG connected thereto) or a plurality of (i.e. 2M) MOS transistors (the MOS transistors BF1, BF2, . . . (other than the MOS transistor BF0) and the MOS transistors TGC and TJDG connected thereto) in parallel.

The eighth embodiment with the aforementioned configuration achieves the effects of the eighth embodiment and the fifth embodiment.

Ninth Embodiment

Figure 24:
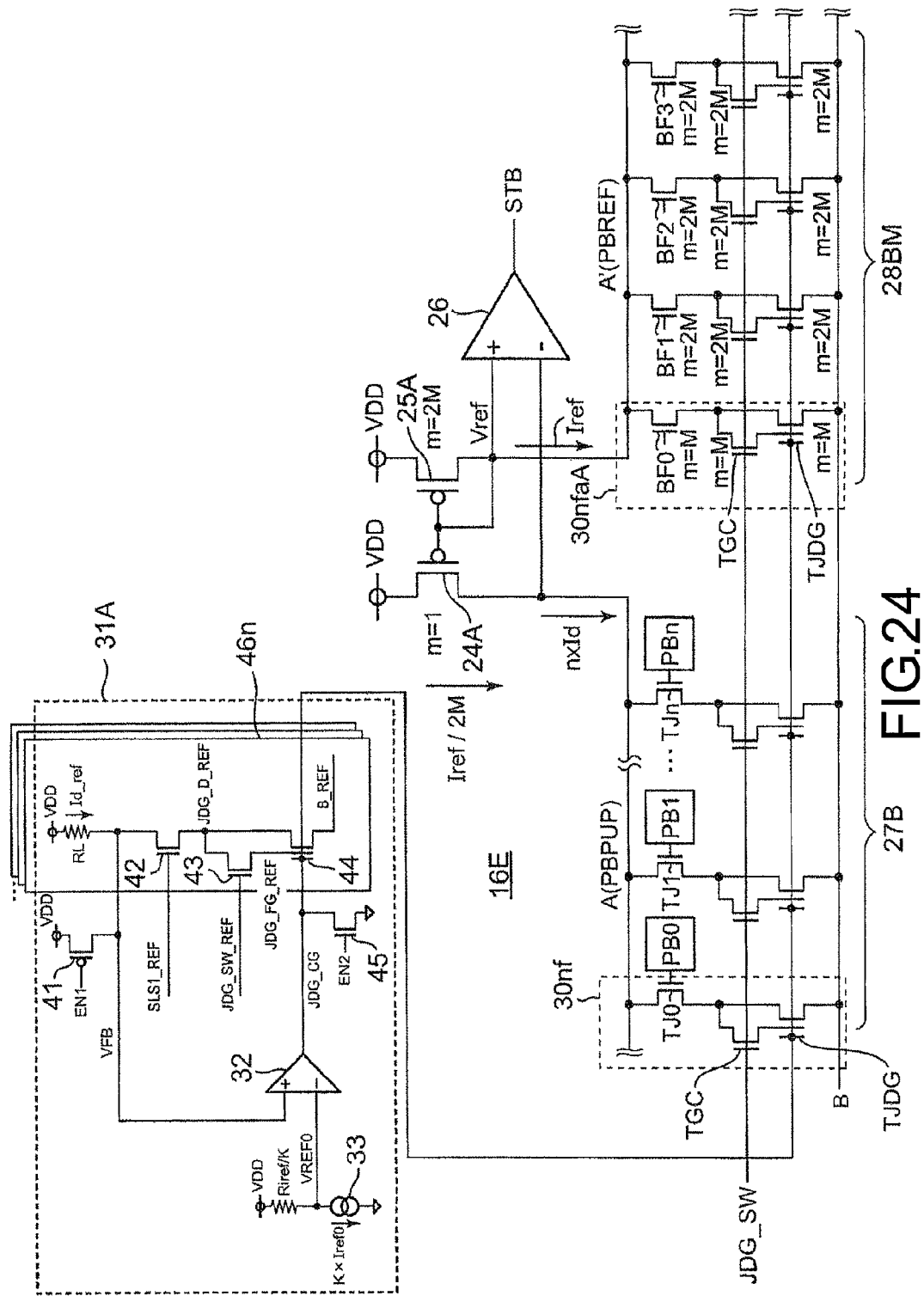
FIG. 24 is a circuit diagram showing the structure of the reference current generation circuit 31A for the programming end detection circuit 16E of FIG. 23 of the ninth embodiment.

FIG. 24 is a circuit diagram showing the structure of the reference current generation circuit 31A for the programming end detection circuit 16E of FIG. 23 of the ninth embodiment. The reference current generation circuit 31A of FIG. 24 is different from the reference current generation circuit 31 of the eighth embodiment of FIG. 23 in the following aspects.

(1) A plurality of (i.e. K) reference current generation parts 46n are connected in parallel, and the reference current generation part 46n include a resistor RL and MOS transistors 42, 43, and 44.

(2) The resistance value of the resistor Riref is set to 1/K.

(3) The current value of the current source Iref0 is set to a multiple of K.

According to the ninth embodiment with the aforementioned configuration, as the number of the reference current generation parts 46n increases, the deviation degree of the MOS transistors 42-44 in the reference current generation circuit 31A traces the deviation degree of the MOS transistor of the programming end determination part 30n more accurately. That is, even if there is deviation in the MOS transistors 42-44, the deviation is averaged to improve the accuracy of signal generation.

Modified Example

The foregoing embodiments are described based on a flash memory, that is, a NAND flash EEPROM, for example. However, the invention is not limited thereto and may also be applied to a non-volatile memory apparatus, such as a NOR flash memory.

Furthermore, in the foregoing embodiments, the TJn and TGC are formed by MOS transistors. However, the invention is not limited thereto, and they may be switches that are turned on/off according to an external control signal.

INDUSTRIAL APPLICABILITY

As specified above, according to the writing circuit and method for the non-volatile memory apparatus of the invention, the process of programming verification determination is performed with high accuracy even if the transistor size of the peripheral circuit is reduced due to shrink of the pitch of the memory cells that results from scaling of the non-volatile memory apparatus, such as a NAND flash memory. Thereby, the number of pseudo-pass bits is improved significantly.

What is claimed is:

1. A writing circuit for a non-volatile memory apparatus that comprises a control circuit, which is disposed in a page buffer temporarily storing data when writing the data to a memory cell and determines that programming of each memory cell ends when writing the data to the memory cell,
wherein the control circuit comprises:
a first switch disposed between a pair of signal lines that outputs a programming end determination signal, wherein an on/off state of the first switch is controlled according to data stored by a memory component, and the memory component stores a programming verification status of the corresponding memory cell;
a determination control metal-oxide-semiconductor (MOS) transistor disposed between the pair of signal lines and performing a determination control of the programming verification; and
a second switch connected between a gate and a source or a drain of the determination control MOS transistor and applying a voltage that controls the determination control MOS transistor to the gate of the determination control MOS transistor according to a predetermined determination control signal,
wherein the control circuit sets a gate voltage of the determination control MOS transistor to a voltage value obtained by adding a predetermined control voltage value to a threshold voltage of the MOS transistor before performing the programming verification.

2. The writing circuit for the non-volatile memory apparatus according to claim 1, wherein:
the predetermined control voltage value is a voltage value in a range of 0 V to 0.5 V.

3. The writing circuit for the non-volatile memory apparatus according to claim 1, further comprising: a circuit that applies the predetermined control voltage value, which is controlled to be a fixed value according to a predetermined reference current, to the gate voltage of the determination control MOS transistor.

4. The writing circuit for the non-volatile memory apparatus according to claim 1, wherein:
the first switch and the second switch are N channel MOS transistors or P channel MOS transistors.

5. The writing circuit for the non-volatile memory apparatus according to claim 4, wherein:
a gate of a MOS transistor that serves as the first switch is connected to any end of a latch of the page buffer or an end of a capacitor that temporarily stores data in a circuit of the page buffer.

6. The writing circuit for the non-volatile memory apparatus according to claim 1, further comprising:
a third switch disposed between the pair of signal lines and cutting a current pass between the pair of signal lines according to a predetermined determination enable signal.

7. The writing circuit for the non-volatile memory apparatus according to claim 1, wherein:
the control circuit sets the gate voltage of the determination control MOS transistor to the voltage value obtained by adding the predetermined control voltage value to the threshold voltage of the MOS transistor after the data stored by the memory component that stores the programming verification status of the corresponding memory cell is inverted.

8. The writing circuit for the non-volatile memory apparatus according to claim 6, wherein:
without inverting the data stored by the memory component that stores the programming verification status of the corresponding memory cell, the control circuit sets the gate voltage of the determination control MOS transistor to the voltage value obtained by adding the predetermined control voltage value to the threshold voltage of the MOS transistor, wherein the predetermined control voltage value is controlled to be the fixed value according to the predetermined reference current.

9. The writing circuit for the non-volatile memory apparatus according to claim 1, wherein:
the determination control MOS transistor comprises a stack gate type MOS transistor that comprises a control gate and a floating gate, and
the floating gate is connected to an end of the second switch,
wherein the control circuit:
(1) sets the floating gate to the voltage value obtained by adding the predetermined control voltage value to the threshold voltage of the MOS transistor in a state of setting a reference voltage applied to the control gate to 0 V in an initial state, and
(2) controls the reference voltage of the control gate such that a drain current that flows through the determination control MOS transistor becomes the predetermined reference current in a control operation state of verification determination.

10. The writing circuit for the non-volatile memory apparatus according to claim 1, comprising:
a programming end determination circuit comprising a plurality of programming end determination parts and determining a programming end of a plurality of memory cells, wherein the programming end determination parts comprise the control circuit connected to the pair of signal lines;
a reference current generation circuit comprising a plurality of reference current generation parts and generating a threshold reference current for determining the number of the programming ends among the memory cells, wherein the reference current generation parts respectively comprise a first MOS transistor connected to a pair of other signal lines and applying a predetermined unit reference current; and
a comparator comparing a voltage corresponding to the current flowing through the programming end determination circuit with the threshold voltage corresponding to the threshold reference current flowing through the reference current generation circuit, and outputting a determination signal that indicates determination of the programming end.

11. The writing circuit for the non-volatile memory apparatus according to claim 10, wherein:
a plurality of second MOS transistors are connected in parallel to form the first MOS transistor of each reference current generation part.

12. A non-volatile memory apparatus, comprising the writing circuit for the non-volatile memory apparatus according to claim 1.

13. A writing method for a non-volatile memory apparatus that comprises a control circuit, which is disposed in a page buffer temporarily storing data when writing the data to a memory cell and determines that programming of each memory cell ends when writing the data to the memory cell,
wherein the control circuit comprises:
a first switch disposed between a pair of signal lines that outputs a programming end determination signal, wherein an on/off state of the first switch is controlled according to data stored by a memory component, and the memory component stores a programming verification status of the corresponding memory cell;
a determination control MOS transistor disposed between the pair of signal lines and performing a determination control of the programming verification; and
a second switch connected between a gate and a source or a drain of the determination control MOS transistor and applying a voltage that controls the determination control MOS transistor to the gate of the determination control MOS transistor according to a predetermined determination control signal,
wherein the writing method for the non-volatile memory apparatus comprises:
a control step of setting a gate voltage of the determination control MOS transistor to a voltage value obtained by adding a control voltage value to a threshold voltage of the MOS transistor before performing the programming verification, wherein the control voltage value is controlled to be a fixed value according to a predetermined reference current.

14. The writing method for the non-volatile memory apparatus according to claim 13, wherein:
the control step comprises a step of setting the gate voltage of the determination control MOS transistor to the voltage value obtained by adding the control voltage value to the threshold voltage of the MOS transistor after inverting the data stored by the memory component that stores the programming verification status of the corresponding memory cell, wherein the control voltage value is controlled to be the fixed value according to the predetermined reference current.

15. The writing method for the non-volatile memory apparatus according to claim 13, wherein:
the control circuit further comprises a third switch disposed between the pair of signal lines and cutting a current pass between the pair of signal lines according to a predetermined determination enable signal, and the control step comprises a step of setting the gate voltage of the determination control MOS transistor to the voltage value obtained by adding the control voltage value to the threshold voltage of the MOS transistor without inverting the data stored by the memory component that stores the programming verification status of the corresponding memory cell, wherein the control voltage value is controlled to be the fixed value according to the predetermined reference current.

16. The writing method for the non-volatile memory apparatus according to claim 13, wherein:

the determination control MOS transistor comprises a stack gate type MOS transistor that comprises a control gate and a floating gate, and the floating gate is connected to an end of the second switch, wherein the control step comprises:

(1) a step of applying a predetermined floating gate reference voltage to the floating gate in a state of setting a reference voltage applied to the control gate to 0 V in an initial state; and (2) controlling the floating gate reference voltage such that a drain current that flows through the determination control MOS transistor becomes the predetermined reference current in a control operation state of verification determination.

* * * * *